(12) United States Patent
Hana et al.

(10) Patent No.: US 11,892,510 B2
(45) Date of Patent: Feb. 6, 2024

(54) INSPECTION DEVICE FOR ROTATING ELECTRIC MACHINE AND METHOD OF INSPECTING ROTATING ELECTRIC MACHINE

(71) Applicant: Mitsubishi Electric Corporation, Tokyo (JP)

(72) Inventors: Norihiko Hana, Tokyo (JP); Masao Akiyoshi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 222 days.

(21) Appl. No.: 17/605,576

(22) PCT Filed: Jun. 12, 2019

(86) PCT No.: PCT/JP2019/023286
§ 371 (c)(1),
(2) Date: Oct. 22, 2021

(87) PCT Pub. No.: WO2020/250339
PCT Pub. Date: Dec. 17, 2020

(65) Prior Publication Data
US 2022/0206071 A1 Jun. 30, 2022

(51) Int. Cl.
*G01R 31/34* (2020.01)
*G01N 21/95* (2006.01)

(52) U.S. Cl.
CPC ......... *G01R 31/34* (2013.01); *G01N 21/9515* (2013.01)

(58) Field of Classification Search
CPC ........ G01R 31/34; G01N 21/29; G01N 21/95; G01N 21/9515; G01N 21/8806;
(Continued)

(56) References Cited

U.S. PATENT DOCUMENTS 6,566,785 B1 5/2003 Tong
2016/0076913 A1\* 3/2016 Bonicci ................ G01D 5/2006
324/207.17
2020/0393385 A1\* 12/2020 Hillel .................... F04D 27/001

FOREIGN PATENT DOCUMENTS

JP 63-65362 A 3/1988
JP 2005-66646 A 3/2005
(Continued)

OTHER PUBLICATIONS

Elektrotechnik & Informationstechnik (2021) 138/2: 96-109. https://doi.org/10.1007/s00502-021-00866-5 Mechanical stress and deformation in the rotors of a high-speed PMSM and IM; M. E. Gerlach, M. Zajonc, B. Ponick. (Year: 2021).\*
(Continued)

*Primary Examiner* — Son T Le
(74) *Attorney, Agent, or Firm* — XSENSUS LLP

(57) ABSTRACT

Provided is an inspection device for a rotating electric machine, including: a storage unit configured to store tendency information indicating a relationship among a position of damage that occurs in an inspection target portion being a range to be inspected of a rotor included in a rotating electric machine, a scale of the damage, and an amount of deformation that occurs in a measurement target portion set on an outer surface of the rotor; a measurement unit configured to measure the amount of deformation that has occurred in the measurement target portion; and a damage estimating unit configured to estimate the position and the scale of the damage that has occurred in the measurement target portion based on the tendency information and the amount of deformation in the measurement target portion, which has been measured by the measurement unit.

17 Claims, 16 Drawing Sheets

(58) Field of Classification Search
CPC ........... G01N 21/6447; G01N 21/8551; H02K 11/21; H02K 15/00
See application file for complete search history.

(56) References Cited

FOREIGN PATENT DOCUMENTS

| | | |
|---|---|---|
| JP | 2012-159477 A | 8/2012 |
| WO | 2020/090082 A1 | 5/2020 |
| WO | 2020/183526 A1 | 9/2020 |

OTHER PUBLICATIONS

International Search Report and Written Opinion dated Aug. 20, 2019, received for PCT Application PCT/JP2019/023286, Filed on Jun. 12, 2019, 6 pages including English Translation.

* cited by examiner

INSPECTION DEVICE FOR ROTATING ELECTRIC MACHINE AND METHOD OF INSPECTING ROTATING ELECTRIC MACHINE

CROSS-REFERENCE TO RELATED APPLICATION

The present application is based on PCT filing PCT/JP2019/023286, filed Jun. 12, 2019, the entire contents of which are incorporated herein by reference.

TECHNICAL FIELD

The present invention relates to an inspection device for a rotating electric machine and a method of inspecting a rotating electric machine.

BACKGROUND ART

In a rotating electric machine such as a power generator, a centrifugal force generated along with rotation of a rotor is applied as a stress to the rotor itself. Thus, there is a concern about aging deterioration of the rotor. In particular, in electric power companies, a large-sized rotating electric machine is used as a power generator, for example, a turbine generator. As the rotating electric machine is increased in size, the rotor is also increased in size. Even when a rotating speed of the rotor is the same, the stress applied to the rotor increases as the rotor is increased in size. Thus, even when the rotating speed of the rotor is the same, the rotor is more liable to be damaged as the rotating electric machine is increased in size.

In general, the rotor of the rotating electric machine used as the turbine generator includes a rotor core also referred to as "core", a rotor winding, and retaining rings. The rotor winding is accommodated in slots formed in the rotor core. A part of the rotor winding extends to an outside of the slots at end portions of the rotor core in an axial direction thereof. In order to retain the extending part of the rotor winding, the retaining rings are mounted to both end portions of the rotor core.

The retaining rings are generally firmly fixed to the rotor core through, for example, shrink-fit so as not to be separated from the rotor core due to a centrifugal force. Thus, a relatively large stress is liable to be generated in the retaining rings. Various techniques for suppressing the stress in the retaining rings have been proposed. For example, in order to prevent movement of the retaining rings in the axial direction with respect to the rotor core, locking keys that project in a radial direction thereof are formed in an outer peripheral portion of the rotor core, and locking key grooves configured to receive the locking keys are formed in an inner peripheral portion of each of the retaining rings (see, for example, Patent Literature 1). A shape and a dimension of each of the locking key grooves are set so as to suppress stress concentration in the retaining rings.

CITATION LIST

Patent Literature

[PTL 1] U.S. Pat. No. 6,566,785 A

SUMMARY OF INVENTION

Technical Problem

In a case of continuous use, an extremely large stress is repeatedly applied to the rotor. Thus, even when measures to suppress the stress concentration are taken, there is a high risk in that the rotor may eventually be damaged. Hitherto, in order to avoid damage to the rotor being in use, the rotating electric machine is periodically disassembled and inspected for each component so that an appropriate treatment such as repair of a component and replacement of a component is conducted. The inspection is conducted after the disassembly because there is a fear of occurrence of damage in a hardly visible portion. However, the inspection of the components after the disassembly of the rotating electric machine needs significant time and cost. As a result, an operating rate of the rotating electric machine significantly drops.

The present invention has been made to solve the problems described above, and has an object to provide an inspection device for a rotating electric machine and a method of inspecting a rotating electric machine, which enable estimation of damage that occurs in a hardly visible portion of a rotor.

Solution to Problem

According to the present invention, there is provided an inspection device for a rotating electric machine, including: a storage unit configured to store tendency information indicating a relationship among a position of damage that occurs in an inspection target portion being a range to be inspected of a rotor included in a rotating electric machine, a scale of the damage, and an amount of deformation that occurs in a measurement target portion set on an outer surface of the rotor; a measurement unit configured to measure the amount of deformation that has occurred in the measurement target portion; and a damage estimating unit configured to estimate the position and the scale of the damage that has occurred in the measurement target portion based on the tendency information and the amount of deformation in the measurement target portion, which has been measured by the measurement unit.

According to the present invention, there is provided a method of inspecting a rotating electric machine, including: a first step of generating tendency information indicating a relationship among a position of damage that occurs in an inspection target portion being a range to be inspected of a rotor included in a rotating electric machine, a scale of the damage, and an amount of deformation that occurs in a measurement target portion set on an outer surface of the rotor; a second step of measuring the amount of deformation that has occurred in the measurement target portion; and a third step of estimating whether or not the damage affecting the measurement target portion has occurred based on the tendency information and the amount of deformation in the measurement target portion, which has been measured in the second step.

Advantageous Effects of Invention

According to the present invention, it is possible to estimate the damage that occurs in the hardly visible portion of the rotor.

DESCRIPTION OF EMBODIMENT

A preferred embodiment of an inspection device for a rotating electric machine and a method of inspecting a rotating electric machine according to the present invention is now described with reference to the drawings. In the following description, the same reference symbols are used for the same components, components regarded as the same, or corresponding components.

First Embodiment

Figure 1:
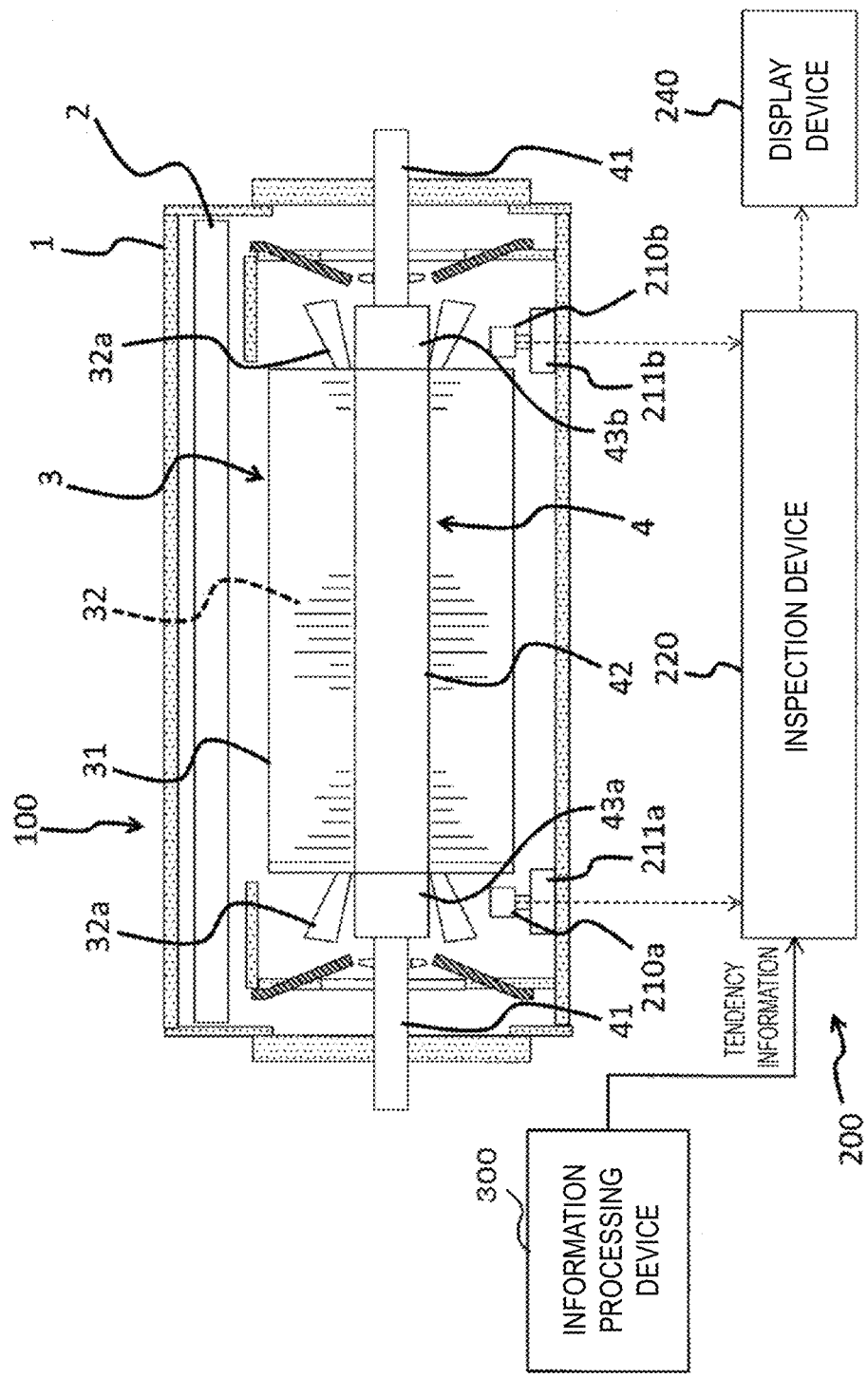
FIG. 1 is a view for illustrating a configuration example of an inspection system that is constructed with an inspection device for a rotating electric machine according to a first embodiment of the present invention.

FIG. 1 is a view for illustrating a configuration example of an inspection system that is constructed with an inspection device for a rotating electric machine according to a first embodiment of the present invention. In FIG. 1, in addition to an inspection system 200, a rotating electric machine 100, which is a target to be inspected, and an information processing device 300 are illustrated.

The rotating electric machine 100 is to be used as, for example, a power generator. A rotating force is transmitted from, for example, a turbine serving as a motor, to the rotating electric machine 100, which is used as a power generator. A kind and a method of use of the rotating electric machine 100, which is a target to be inspected, are not particularly limited. The rotating electric machine 100 may be configured to, for example, convert electric power into a rotating force.

Before a description of the inspection system 200 is given, the rotating electric machine 100, which is a target to be inspected, is specifically described. As illustrated in FIG. 1, the rotating electric machine 100 includes a frame 1, a gas cooler 2 provided inside the frame 1, a stator 3, and a rotor 4. A refrigerant, for example, a cooling gas for removing heat generated as a result of power generation is circulated inside the frame 1. The gas cooler 2 is configured to cool the refrigerant.

The stator 3 includes a stator core 31 and a stator winding 32. The stator core 31 has a cylindrical outer shape, and is provided inside the frame 1 in a fixed manner. A plurality of slots, each having a groove-like shape, are formed in an inner peripheral portion of the stator core 31. The stator winding 32 serving as an armature winding is inserted into each of the slots of the stator core 31. A part of the stator winding 32 is led out from both end portions of the stator core 31 to form coil ends 32a. A main lead (not shown) extending to an outside of the frame 1 is connected to one of the coil ends 32a. Generated electric power is supplied from the rotating electric machine 100 via the main lead to the outside.

The rotor 4 includes a pair of rotary shafts 41, a rotor core 42, and retaining rings 43a and 43b. The pair of rotary shafts 41 are arranged so as to sandwich the rotor core 42 therebetween. Axial centers of the pair of rotary shafts 41 and an axial center of the rotor core 42 match each other. A direction parallel to the axial centers of the pair of rotary shafts 41 and the rotor core 42 is hereinafter referred to as "axial direction". Further, a direction perpendicular to the axial direction, which has the axial centers of the pair of rotary shafts 41 and the rotor core 42 as a center, is referred to as "radial direction". A direction perpendicular to the axial direction and the radial direction, which has the axial centers of the pair of rotary shafts 41 and the rotor core 42 as a center, is referred to as "circumferential direction".

The pair of rotary shafts 41 are rotatably supported by bearings provided to the frame 1. The rotor 4 is rotated relative to the stator 3 by a turbine, which is a motor (not shown). The stator core 31 and the stator winding 32 are located on a radially outer side of the rotor core 42, and receive magnetic flux generated by the rotor core 42 to generate a current in the stator winding 32. The retaining rings 43a and 43b are components configured to hold a state of the rotor core 42. The retaining rings 43a and 43b are mounted to one end portion and the other end portion of the rotor core 42, respectively, and are exposed to an outside of the stator core 31.

For the rotating electric machine 100 illustrated in FIG. 1, which is used as a turbine generator, measurement of an amount of deformation that occurs in an outer surface of the rotor 4 through a digital image correlation method is assumed. The inspection system 200 is a system that is constructed so as to measure the amount of deformation that occurs in the outer surface and evaluate a state of a portion that may affect a shape of the outer surface based on a result of the measurement. The portion that may affect the outer surface is an inspection target portion, and the outer surface for which the amount of deformation is measured is set as a measurement target portion. The inspection target portion is determined assuming a portion of the rotor 4, in which damage is relatively liable to occur. The measurement target portion is set in accordance with the inspection target portion. In this embodiment, strain is to be measured as the amount of deformation. The amount of deformation to be measured is not limited to the strain.

As illustrated in FIG. 1, the inspection system 200 includes image pickup apparatus 210*a* and 210*b*, drive mechanisms 211*a* and 211*b*, an inspection device 220, and a display device 240. The image pickup apparatus 210*a* and 210*b* are arranged inside the frame 1 of the rotating electric machine 100. Each of the image pickup apparatus 210*a* and 210*b* picks up an image of a measurement target portion set to a portion of the outer surface of the rotor 4 to generate image data of the measurement target portion, and transmits the generated image data to the inspection device 220. When the drive mechanisms 211*a* and 211*b* move the image pickup apparatus 210*a* and 210*b* inside the frame 1, image pickup ranges of the image pickup apparatus 210*a* and 210*b* can be changed, respectively.

In this embodiment, the measurement target portions are set on outer surfaces of the retaining rings 43*a* and 43*b*, respectively. Thus, the image pickup apparatus 210*a* is provided in the vicinity of the retaining ring 43*a*, and picks up an image of the retaining ring 43*a* while being moved by the drive mechanism 211*a*. The image pickup apparatus 210*b* is provided in the vicinity of the retaining ring 43*b*, and picks up an image of the retaining ring 43*b* while being moved by the drive mechanism 211*b*.

The image pickup apparatus 210*a* and 210*b* pick up images of the retaining rings 43*a* and 43*b* in a specific initial time period, and transmit image data generated through the image pickup as initial image data to the inspection device 220. The initial time period is, for example, a time period from completion of manufacture of the rotating electric machine 100 to start of an operation of the rotating electric machine 100. After the start of the operation of the rotating electric machine 100, the image pickup apparatus 210*a* and 210*b* pick up images of the retaining rings 43*a* and 43*b* at a predetermined inspection time, and transmit generated image data as inspection image data to the inspection device 220. The inspection time is determined to be repeated, for example, in a predetermined cycle after the start of the operation of the rotating electric machine 100. This cycle may be updated so as to become gradually shorter as elapsed time after the start of the operation of the rotating electric machine 100 becomes longer. This cycle may be not merely elapsed time but actual operation time of the rotating electric machine 100. Further, a stress applied to the rotor 4 depends on, for example, the number of rotations, a rotating speed, and a rotational acceleration of the rotor 4. Thus, the cycle may be determined based on at least one of the number of rotations, the rotating speed, and the rotational acceleration of the rotor 4. A deterioration rate of the rotor 4 differs depending on a temperature or a humidity inside the frame 1. Thus, the cycle may be determined based on the temperature or the humidity inside the frame 1. A plurality of cycles may be determined based on different criteria. In this case, one of the thus determined plurality of cycles is selected.

In this embodiment, the images of the retaining rings 43*a* and 43*b* are picked up by the image pickup apparatus 210*a* and 210*b* under a state in which the rotor 4 is being rotated at low speed by the motor. For example, when each of the image pickup apparatus 210*a* and 210*b* includes a stroboscopic light source and image pickup elements, each of the image pickup apparatus 210*a* and 210*b* is controlled to cause the stroboscopic light source to emit light and cause the image pickup elements to perform image pickup in synchronization with the rotation of the rotor 4. When the image pickup is performed during the rotation of the rotor 4, images of the entire retaining rings 43*a* and 43*b* in the circumferential direction can be picked up without moving the image pickup apparatus 210*a* and 201*b* in the circumferential direction. Thus, configurations of the drive mechanism 211*a* and 211*b* can be simplified, and thus the number of image pickup apparatus that are needed for the inspection is reduced.

The inspection device 220 controls the image pickup apparatus 210*a* and 210*b* to generate a change in strain distribution in the measurement target portion as strain change information through the digital image correlation method based on the image data generated by the image pickup apparatus 210*a* and 210*b*. When an image of a surface of a target object is picked up before and after deformation of the target object, the digital image correlation method enables acquisition of an amount of displacement that occurs in the surface of the target object and a displacement direction thereof at the same time from a brightness distribution of the obtained image data. Thus, the strain change information includes information of the amount of displacement, the displacement direction, and a position in the measurement target portion. When various pieces of information generated by the inspection device 220 are input to the display device 240, the display device 240 displays the input information.

Before a description of details of the inspection device 220 is given, details of the rotor 4 are described. In this case, in order to clarify a positional relationship between portions and components in a plurality of drawings, an X direction, a Y direction, and a Z direction, which are perpendicular to each other, are defined. Arrows indicating the X direction, the Y direction, and the Z direction are illustrated in the drawings as needed. The X direction is parallel to the axial direction described above. The Y direction and the Z direction are parallel to one of the radial directions described above.

The details of the rotor 4 are specifically described with reference to FIG. 2 to FIG. 7 with focus on configurations of the retaining rings 43*a* and 43*b*, for which the measurement target portions are set in this embodiment, and regions therearound. In this case, the configurations of the retaining ring 43*a* and the region therearound are mainly described so as to avoid confusion. This is because the configurations of the retaining ring 43*b* and the region therearound are the same as those of the retaining ring 43*a* and the region therearound. When two retaining rings 43*a* and 43*b* are not required to be distinguished from each other, the retaining rings are collectively denoted by the reference symbol "43". Other components are also denoted in the same manner.

Figure 2:
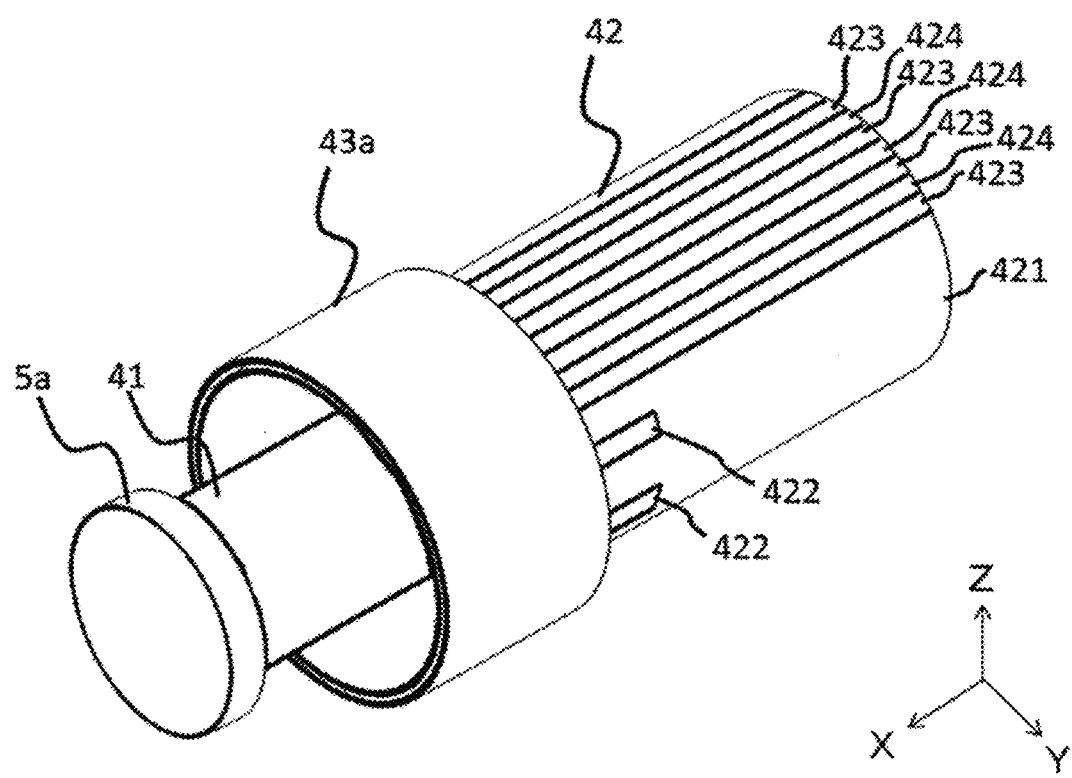
FIG. 2 is an outside perspective view of a retaining ring and a region therearound.

FIG. 2 is an outside perspective view of the retaining ring and the region therearound. As illustrated in FIG. 2, a flange portion 5*a* is formed at one end portion of the rotary shaft 41. A rotary shaft of the turbine serving as a motor is connected to the flange portion 5*a*. As a result, motive power from the turbine is transmitted to the rotary shaft 41.

As described above, the rotor core 42 is coaxial with the rotary shaft 41, and extends in the axial direction. The retaining ring 43a has a cylindrical outer shape, and is provided in such a manner as to surround a coupling portion between the rotor core 42 and the rotary shaft 41. A pair of magnetic pole portions 421, a plurality of slots 423, and a plurality of retaining portions 424 are formed on an outer peripheral portion of the rotor core 42. The pair of magnetic pole portions 421, the plurality of slots 423, and the plurality of retaining portions 424 extend in the axial direction. In FIG. 2, only one of the pair of magnetic pole portions 421 is illustrated. A plurality of air path portions 422 extending in the axial direction are formed in each of the magnetic pole portions 421.

Figure 3:
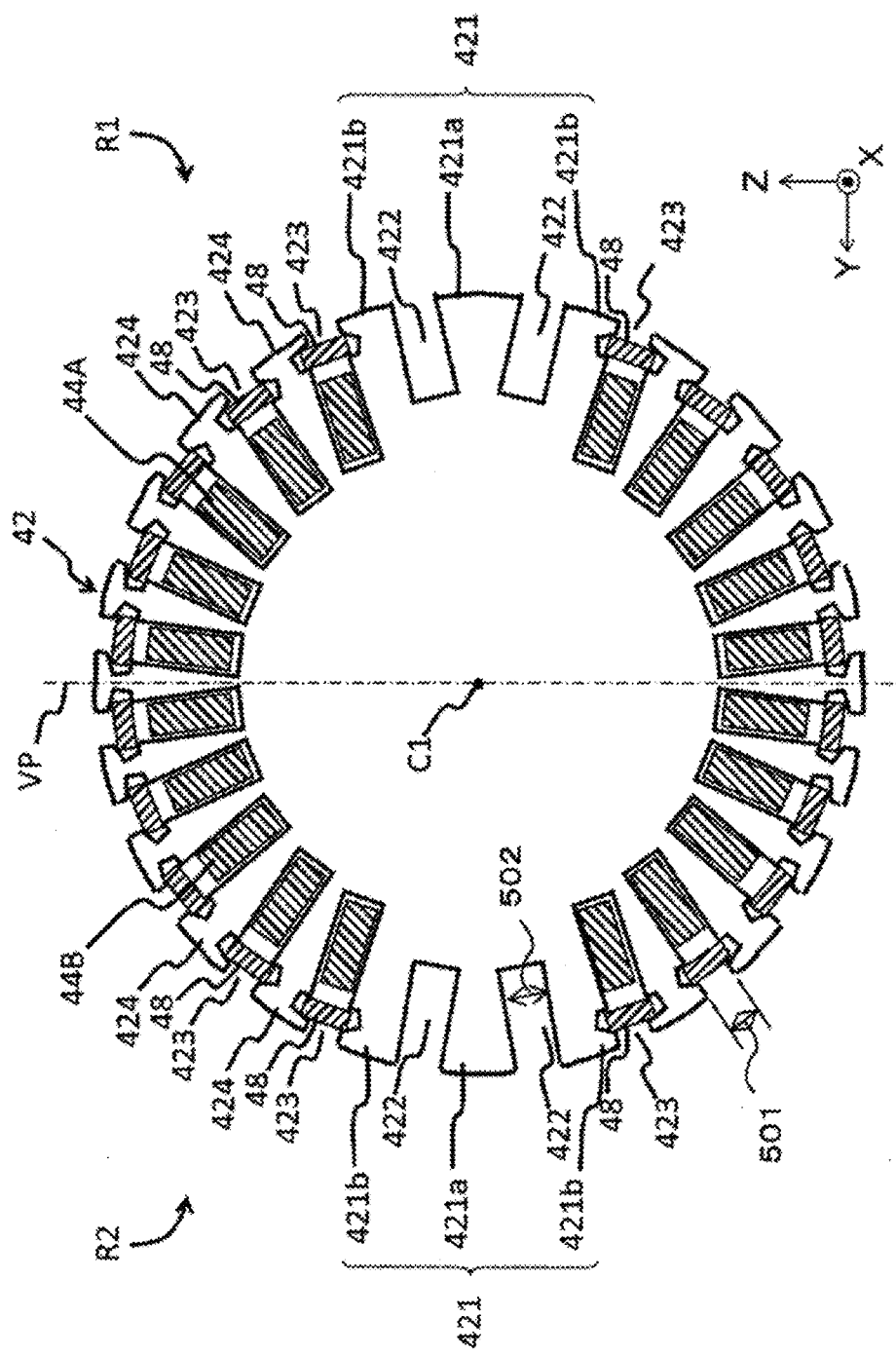
FIG. 3 is a sectional view of a rotor core.

FIG. 3 is a sectional view of the rotor core. In the sectional view of FIG. 3, the rotor core 42 is taken along an axis-perpendicular plane, which is a plane perpendicular to the axial direction. As illustrated in FIG. 3, continuous recesses and protrusions are formed on the outer peripheral portion of the rotor core 42 in the circumferential direction in the axis-perpendicular plane. Each of the air path portions 422 and the slots 423 has a recessed shape in the axis-perpendicular plane. In practice, as illustrated in FIG. 2, the air path portions 422 and the slots 423 each have a groove-like shape extending in the axial direction. All the slots 423 have the same width 501 in the circumferential direction. The air path portions 422 and the slots 423 are formed so as to be spaced apart from each other in the circumferential direction.

Each of the magnetic pole portions 421 includes a magnetic-pole center portion 421a and a pair of magnetic-pole end portions 421b. The pair of magnetic-pole end portions 421b are formed so as to sandwich the magnetic-pole center portion 421a in the circumferential direction. The plurality of air path portions 422 are formed between the magnetic-pole center portion 421a and the pair of magnetic-pole end portions 421b. More specifically, one pair of air path portions 422 extend by a predetermined length along the axial direction from one end portion toward a center portion of each of the magnetic pole portions 421. Further, one pair of air path portions 422 extend by a predetermined length along the axial direction from the other end portion toward the center portion of each of the magnetic pole portions 421. The air path portions 422 have the same width 502 in the circumferential direction. A gas, which has cooled the coil ends of the rotor, that is, both end portions of each of rotor windings 44A and 44B described later, is released through the air path portions 422.

Now, as illustrated in FIG. 3, an imaginary plane VP, which passes through an axial center C1 of the rotor core 42, is parallel to the axial direction, and is perpendicular to a line for connecting the pair of magnetic pole portions 421 to each other, is defined. The outer peripheral portion of the rotor core 42 can be divided into a region R1 and a region R2 with respect to the imaginary plane VP as a boundary. One of the magnetic pole portions 421 is provided in a center of the region R1 in the circumferential direction, and the other one of the magnetic pole portions 421 is provided in a center of the region R2 in the circumferential direction. The plurality of slots 423 and the plurality of retaining portions 424 are arranged alternately between the pair of magnetic pole portions 421 in the circumferential direction. The rotor winding 44A serving as a field winding is inserted into the plurality of slots 423 in the region R1. The rotor winding 44B serving as a field winding is inserted into the plurality of slots 423 in the region R2. As described above, one of the rotor windings 44A and 44B is to be inserted into each of the slots 423.

A wedge 48 is arranged in each of the slots 423 on a radially outer side of the rotor windings 44A and 44B. Each of the retaining portions 424 has a hook-shaped distal end portion to restrict movement of the wedge 48 in the radial direction. In this manner, separation of the rotor windings 44A and 44B from the slots 423 due to a centrifugal force is prevented. A width of each of the magnetic pole portions 421 in the circumferential direction is larger than a width of each of the retaining portions 424 in the circumferential direction. Through setting of the width of each of the retaining portions 424, the number of turns of each of the rotor windings 44A and 44B can be changed. Further, through setting of the width of each of the magnetic pole portions 421, a magnitude of magnetic flux generated from the rotor core 42 can be changed. In this embodiment, each of widths of the magnetic-pole center portion 421a and the magnetic pole end portions 421b in the circumferential direction is larger than the width of each of the retaining portions 424 in the circumferential direction.

Figure 4:
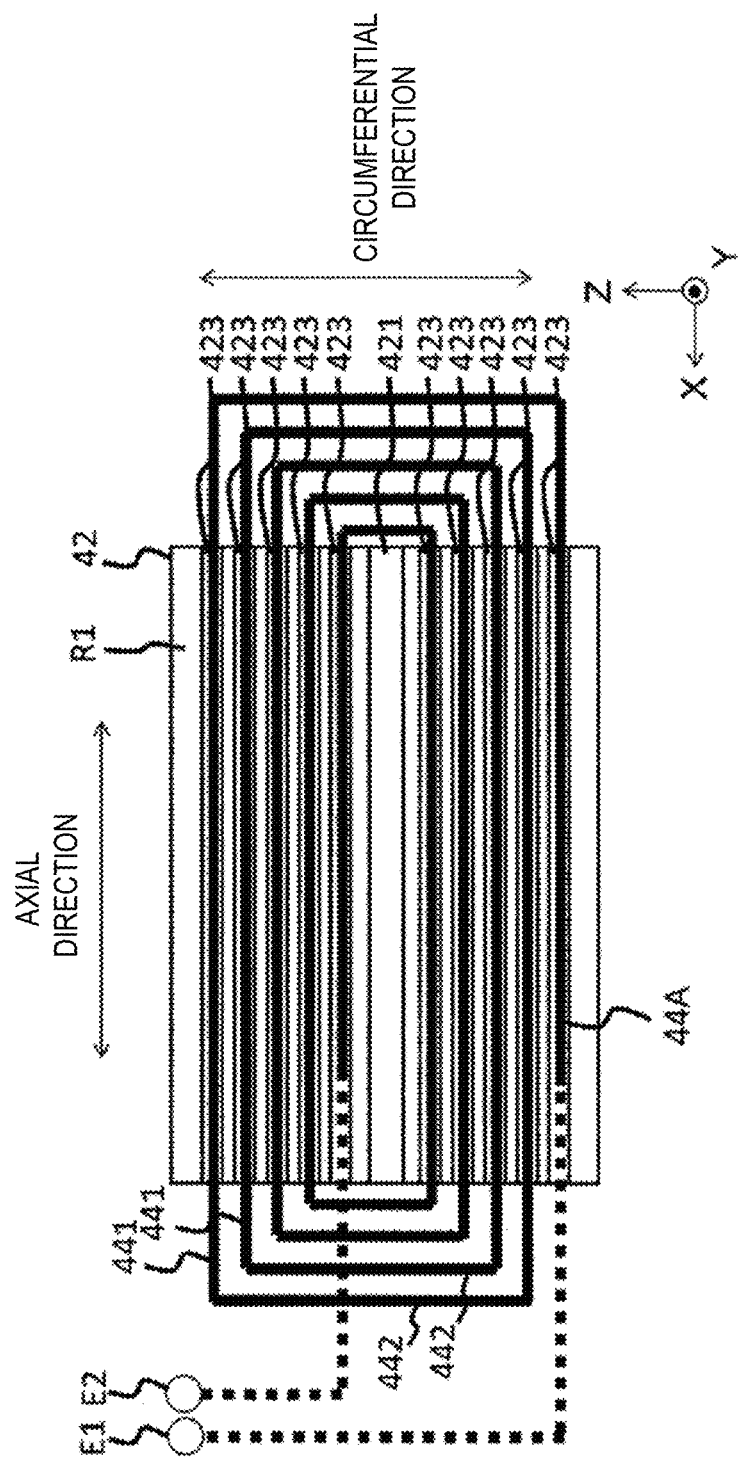
FIG. 4 is a schematic view for illustrating, when the rotor core is divided into two regions along a plane perpendicular to an axis, a relationship between slots formed in one of the regions and a rotor winding.

FIG. 4 is a schematic view for illustrating, when the rotor core is divided into two regions along the axis-perpendicular plane, a relationship between the slots and the rotor winding, which are formed and provided in one of the regions. In FIG. 4, the region R1 and the rotor winding 44A are illustrated in a plan view. In FIG. 4, a horizontal direction corresponds to the axial direction, that is, the X direction, and a vertical direction corresponds to the circumferential direction. The slots 423 and the rotor winding 44B, which are formed and provided in the region R2, are the same as the slots 423 and the rotor winding 44A illustrated in FIG. 4.

As illustrated in FIG. 4, the rotor winding 44A includes a plurality of linear portions 441 extending in the axial direction and a plurality of linear portions 442 extending in the circumferential direction. The rotor winding 44A is wound around the magnetic pole portion 421 in a helical manner. The plurality of linear portions 441 are inserted into the plurality of slots 423 in the region R1, and each have both end portions extending to an outside of the plurality of slots 423 in the axial direction. The plurality of linear portions 442 are arranged outside the plurality of slots 423 in the axial direction. One end portion E1 and the other end portion E2 of the rotor winding 44A are led to an outside of the rotor core 42 in the axial direction through an internal passage formed in the rotor core 42 to be connected to an exciter (not shown).

Figure 5:
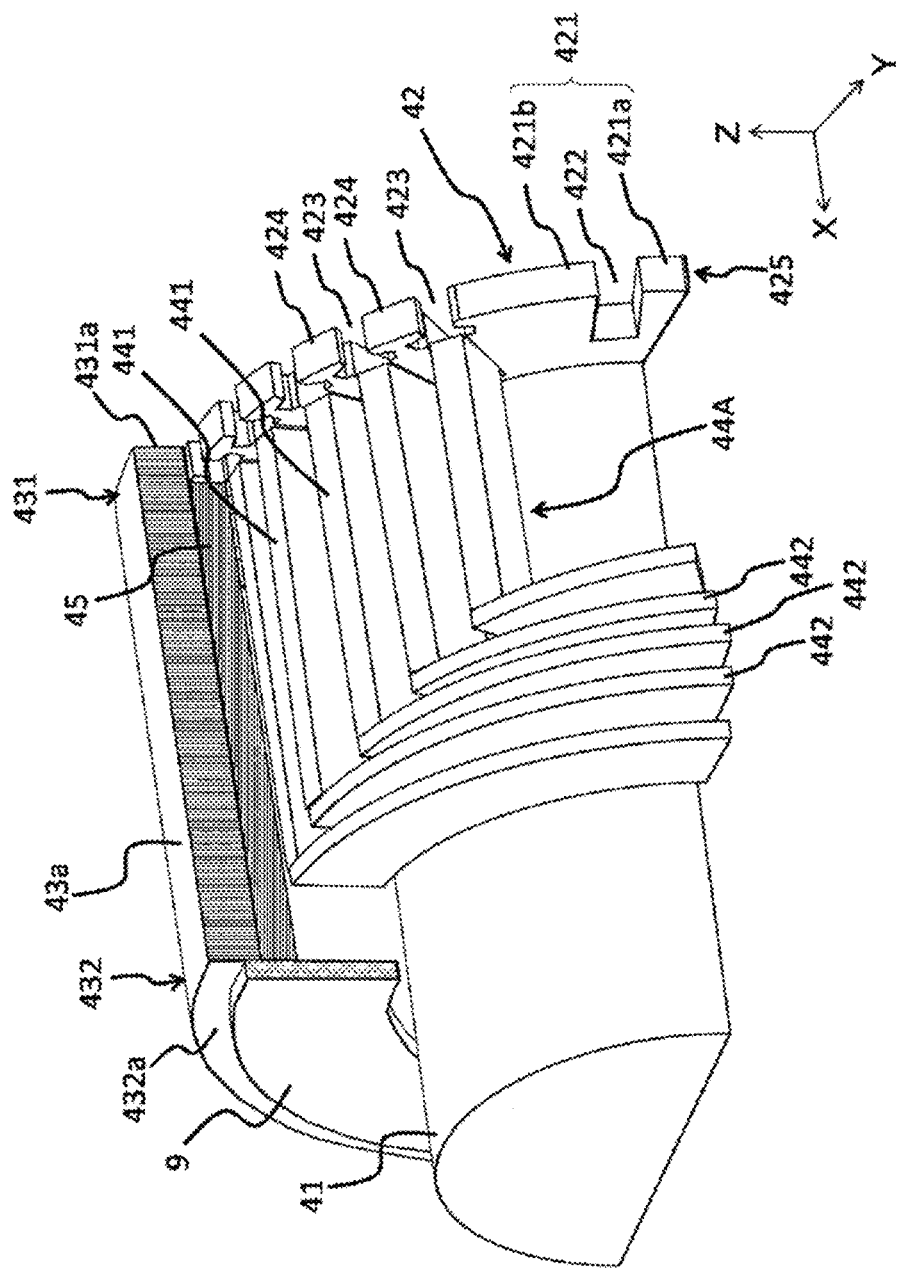
FIG. 5 is a partially cutaway perspective view of the retaining ring and a region therearound.

FIG. 5 is a partially cutaway perspective view of the retaining ring and a region therearound. In FIG. 5, only end portions of the magnetic pole portion 421, the air path portions 422, the slots 423, and the retaining portions 424 are illustrated. Each of the linear portions 441 of the rotor winding 44A extends from the end portion of the slot 423 to an outside in the axial direction to be continuous with one of the linear portions 442. The retaining ring 43a is provided so as to cover a portion of the rotor winding 44A, which extends to the outside of the slots 423. An insulation 45 having a cylindrical shape is arranged between the retaining ring 43a and the rotor winding 44A on an outer side of the slots 423 in the axial direction. One end portion of the retaining ring 43a is joined to end portions of the magnetic pole portion 421 and the plurality of retaining portions 424. The retaining ring 43 is configured to retain the linear portions 441 and 442 inside. In this manner, the retaining ring 43 holds a state of the rotor winding 44A inserted into the rotor core 42.

An end portion of the retaining ring 43a on the rotor core 42 side is hereinafter referred to as "core-side end portion 431", and the other end portion thereof is hereinafter referred to as "plate-side end portion 432". Further, a portion including the end portion of the magnetic pole portion 421 and the end portions of the plurality of retaining portions 424, to which the core-side end portion 431 of the retaining ring 43a is to be joined, is referred to as "mounting portion 425". The mounting portion 425 is a portion of the rotor core 42, which is formed for the retaining ring 43a. A width of the core-side end portion 431 in the axial direction is equal to a width of the mounting portion 425 of the rotor core 42 in the axial direction. In other words, the core-side end portion 431 and the mounting portion 425 overlap with each other in the radial direction. The plate-side end portion 432 of the retaining ring 43a is located on a radially outer side of the rotary shaft 41.

The core-side end portion 431 of the retaining ring 43a is required to be firmly joined to the mounting portion 425 of the rotor core 42 so that the retaining ring 43a is not separated from the rotor core 42 due to a centrifugal force. Thus, in this embodiment, the core-side end portion 431 of the retaining ring 43a is joined to the mounting portion 425 of the rotor core 42 through shrink-fit.

The core-side end portion 431 has an end surface 431a perpendicular to the axial direction. The plate-side end portion 432 has an end surface 432a perpendicular to the axial direction. An end plate 9 having an annular shape is mounted to the end surface 432a of the plate-side end portion 432. At a time of shrink-fit of the retaining ring 43a to the rotor core 42, the core-side end portion 431 of the retaining ring 43a shrinks. Thus, a shape of the retaining ring 43a may be deformed as a whole. The deformation of the retaining ring 43a is suppressed by mounting the end plate 9 onto the end surface 432a of the plate-side end portion 432. The end plate 9 is not in contact with the rotary shaft 41, and a space is defined between an inner peripheral surface of the end plate 9 and an outer peripheral surface of the rotary shaft 41.

The end plate 9 is required to be firmly fixed to the plate-side end portion 432 so that the end plate 9 is not separated from the retaining ring 43a due to a centrifugal force. Thus, in this embodiment, the end plate 9 is joined to the plate-side end portion 432 through shrink-fit.

When two components are joined through shrink-fit, a large stress is generated with the two components. The stress is liable to damage the components. Thus, when the measurement target portion is set on the retaining ring 43, the presence or absence of damage that may occur in the rotating electric machine 100, more specifically, in a portion assumed as the inspection target portion can be estimated. This is why the measurement target portion is set on the retaining ring 43 in this embodiment.

Figure 6:
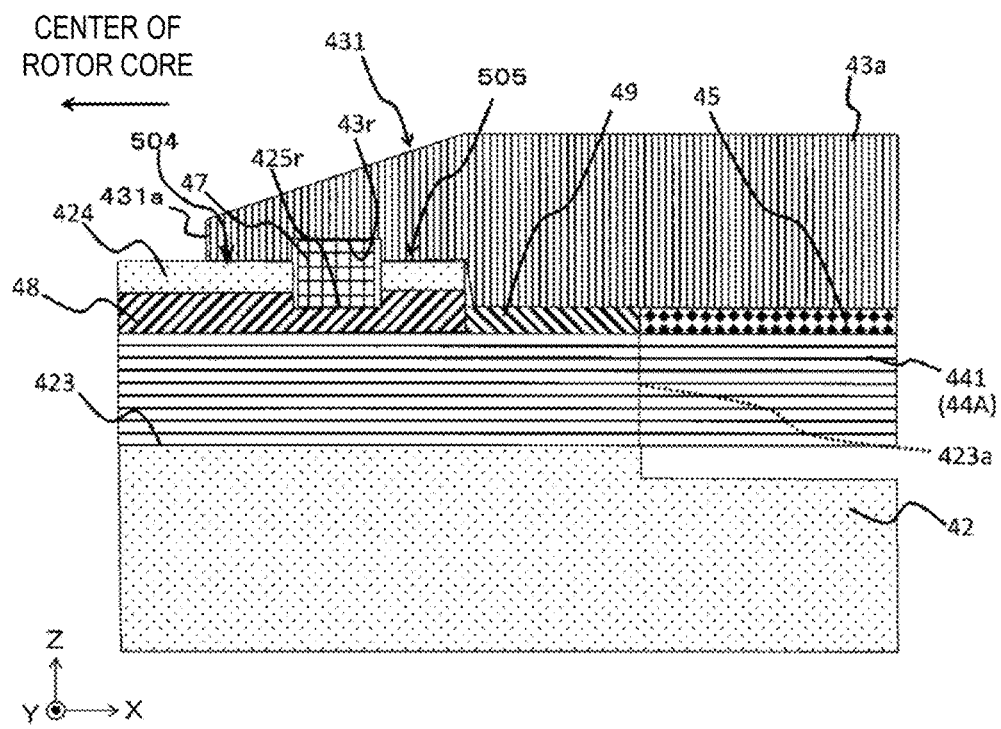
FIG. 6 is a sectional view of the retaining ring and a region therearound.

FIG. 6 is a sectional view of the retaining ring and a region therearound. In the cross section in FIG. 6, the retaining ring 43a and the region therearound are taken along an axis-parallel plane, which is a plane parallel to the axial direction. The axis-parallel plane is defined as a plane extending along the linear portion 441 in one slot 423. In FIG. 6, a leftward direction is a direction toward a center of the rotor core 42, that is, corresponds to a rightward direction in FIG. 5.

As illustrated in FIG. 6, the linear portion 441 of the rotor winding 44A is arranged in the slot 423. In FIG. 6, an end portion 423a of the slot 423 is indicated by a dotted line. The linear portion 441 extends in the axial direction beyond the end portion 423a of the slot 423. As described above, the wedge 48 is arranged so as to overlap with the linear portion 441 of the rotor winding 44A in the slot 423. As a result of fixing of the wedge 48 in the radial direction with the hook-shaped distal end portion of the retaining portion 424, separation of the linear portion 441 from the slot 423 is prevented. A wedge 49 is arranged in such a manner as to be adjacent to the wedge 48 in the axial direction. The wedge 49 is located between the wedge 48 and the insulation 45. The insulation 45 is positioned by the wedge 49 in the axial direction.

A recessed portion 425r is formed in the mounting portion 425 of the rotor core 42 and the wedge 48 along the circumferential direction. As a result, a joint portion at which the retaining portion 424 being a part of the mounting portion 425 is joined to the retaining ring 43a is divided into a first joint portion 504 and a second joint portion 505 by the recessed portion 425r in the axial direction. The first joint portion 504 is a joint portion, which is located on a side closer to the center of the rotor core 42 with respect to the recessed portion 453r in the axial direction. The second joint portion 505 is a joint portion, which is located on a side closer to the flange portion 5a with respect to the recessed portion 435r in the axial direction. The end surface 431a is a side surface of the retaining ring 43a, which is located on a side closer to the center of the rotor core 42.

A recessed portion 43r having the same width as that of the recessed portion 425r in the axial direction is formed in an inner peripheral portion of the core-side end portion 431 of the retaining ring 43a along the circumferential direction. A ring key 47 is arranged in the recessed portions 425r and 43r. The ring key 47 has an annular shape having the axial center C1 of the rotor core 42, which is illustrated in FIG. 3, as a center. The ring key 47 prevents movement of the retaining ring 43a with respect to the rotor core 42 in the axial direction.

As described above, the inspection device 220 generates the strain change information of the measurement target portion through the digital image correlation method based on the inspection image data of the measurement target portion. With the digital image correlation method, a change in strain distribution in the measurement target portion is obtained based on a change in random pattern contained in the inspection image data. The random pattern is formed on an outer surface of each of the retaining rings 43a and 43b, which is the measurement target portion, so as to obtain the strain distribution. The random pattern is a pattern without regularity, and is made up of, for example, a large number of randomly arranged dots. The random pattern is formed so that measurement can be carried out through the digital image correlation method with a sufficient resolution for assumed strain.

Figure 7:
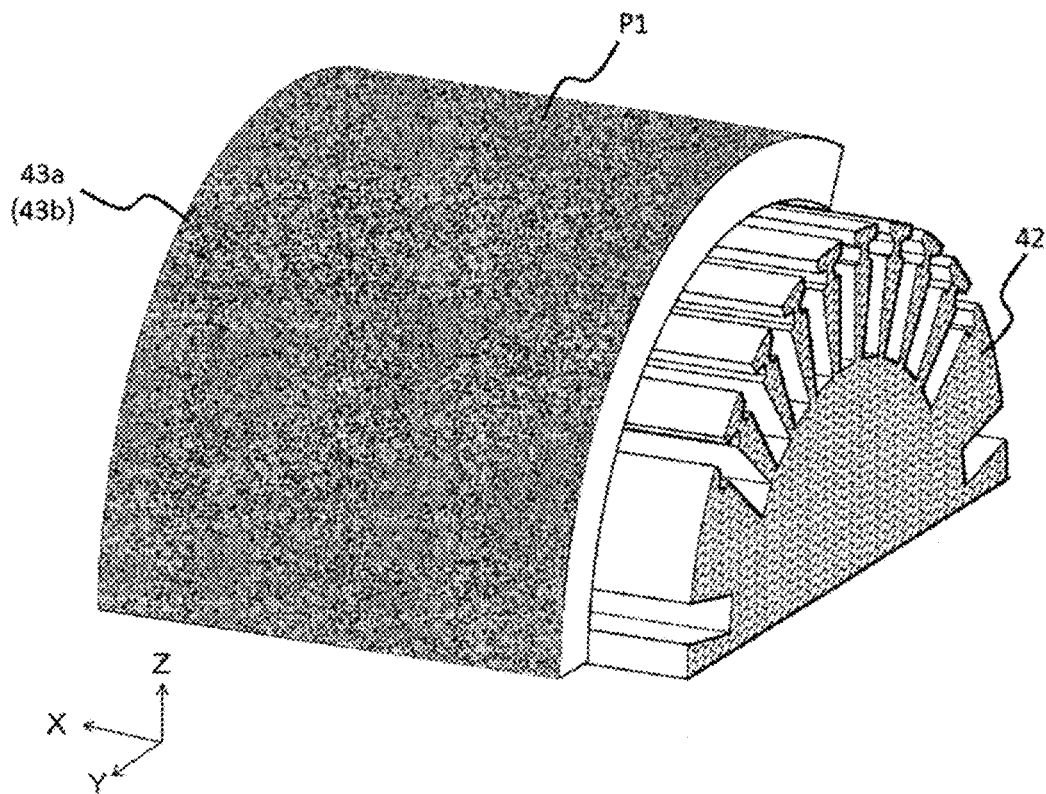
FIG. 7 is a partially cutaway perspective view for illustrating an example of a random pattern formed on the retaining ring.

FIG. 7 is a partially cutaway perspective view for illustrating an example of the random pattern formed on the retaining ring. The perspective view of FIG. 7 is viewed from a point of view different from that for the perspective view of FIG. 5, and has a point of view located closer to the center of the rotor core 42. In FIG. 7, an example of formation of a random pattern P1 on the retaining ring 43a is illustrated. A similar random pattern is also formed on the retaining ring 43b.

In the example of FIG. 7, an image pickup target is assumed to be an entire outer peripheral surface of the retaining ring 43a. On this assumption, as illustrated in FIG. 7, the random pattern P1 is formed on the entire outer peripheral surface. The random pattern P1 is formed by, for example, application of a paint onto an outer peripheral surface of the retaining ring 43a. Specifically, the random pattern P1 is formed with paints of two colors, which are significantly different in contrast, more specifically, for example, paints of white and black. The white paint is applied onto the entire outer peripheral surface of each of the retaining rings 43a and 43b, and the black paint is applied so that a plurality of black micro-points are arranged thereon in a non-uniform manner. As a result, the random pattern P1 in two colors, that is, white and black, is formed. A size of each of the black points is only required to be set so as to fall within a range of, for example, from several micrometers to several millimeters. As the size of each of the black points is decreased, a resolution for strain through the digital image correlation method is improved. Further, as a distance between the black points is reduced, the resolution for strain through the digital image correlation method is improved. The size of each of the black points and the distance between the black points are set based on a magnitude of strain to be measured and the amount of deformation that is assumed in the measurement target portion. In this manner, the entire random pattern P1 or a part thereof may be set as the measurement target portion.

The retaining ring 43a, 43b is firmly joined to the rotor core 42 and the end plate 9. Thus, a stress is liable to concentrate in joint portions between the above-mentioned components not only while the rotating electric machine 100 is operating but also when the rotating electric machine 100 is in a stop state. Further, the ring key 47 configured to inhibit relative movement between the retaining ring 43a, 43b and the rotor core 42 in the axial direction is arranged between the retaining ring 43a, 43b and the rotor core 42. A stress is also liable to concentrate in each of a portion of the retaining ring 43a, 43b and a portion of the rotor core 42, which are in contact with the ring key 47. As a result, a strain distribution steadily occurs in the retaining ring 43a, 43b. The strain distribution in the retaining ring 43a, 43b changes not only when damage such as a crack occurs in the retaining ring 43a, 43b but also when damage such as a crack occurs in a region therearound. Thus, in this embodiment, not only a state of the retaining ring 43a, 43b but also states of the rotor core 42 and the end plate 9 are inspected based on image data of the outer peripheral surface of the retaining ring 43a, 43b, which is set as the measurement target portion. Thus, the inspection target portion includes not only the retaining ring 43a, 43b but also the mounting portion 425 and the end plate 9.

The inspection target portion and the measurement target portion are not limited to those described above. The inspection target portion and the measurement target portion are only required to be set in accordance with a configuration of the rotor 4.

A crack or other damage that occurs in the outer peripheral surfaces of the retaining rings 43a and 43b, in other words, the outer surfaces whose images can be picked up by the image pickup apparatus 210a and 210b can relatively easily be specified based on the image data obtained through the image pickup. Thus, the inspection through the measurement of strain mainly assumes an estimation of damage that occurs in a hardly visible portion, that is, a region for which image pickup is impossible or difficult. The inspection enables measures to be taken before damage such as a crack occurs in the outer peripheral surface of the retaining ring 43a, 43b. The need for disassembly of the rotating electric machine 100 for the inspection is reduced. Thus, an operating rate of the rotating electric machine 100 can be further improved by specifying damage that occurs in a hardly visible portion of the inspection target portion. Thus, the rotating electric machine 100 can be operated in a more appropriate state. As a result, a life of the rotating electric machine 100 can easily be further extended, while the operating rate thereof is further improved.

Figure 8:
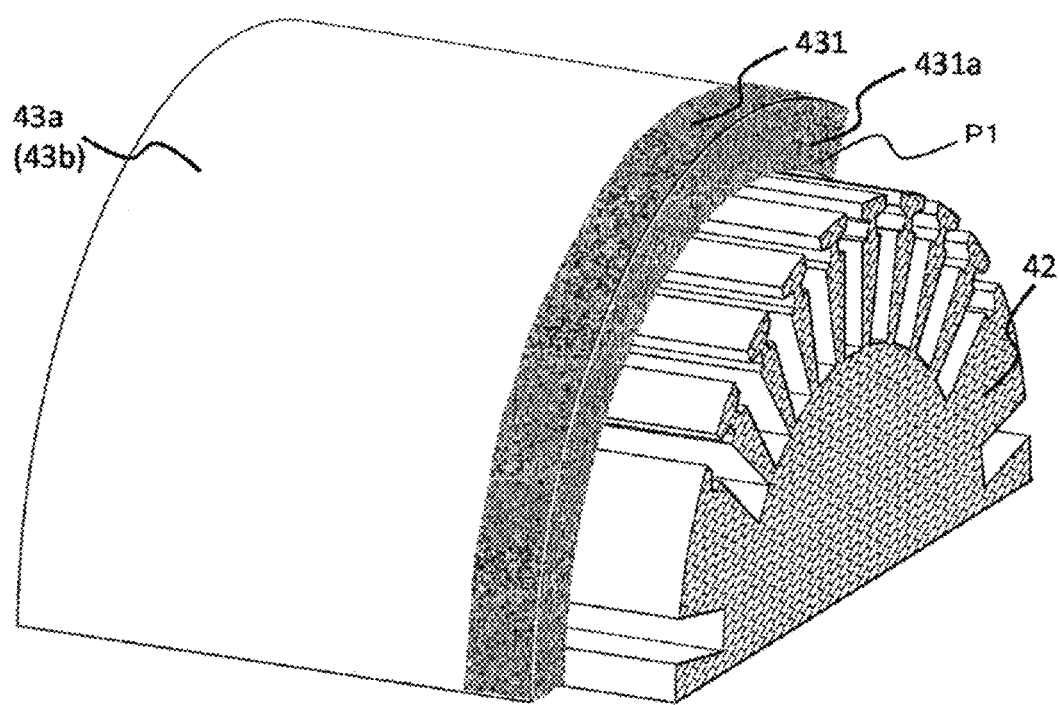
FIG. 8 is a partially cutaway perspective view for illustrating another example of the random pattern formed on the retaining ring.

As illustrated in FIG. 8, the random pattern P1 may be formed not only on an outer peripheral surface of the core-side end portion 431 of each of the retaining rings 43a and 43b but also on the end surface 431a of the core-side end portion 431. When the random pattern P1 is formed even on the end surfaces 431a, accuracy of estimation of damage in the inspection target portion, that is, inspection accuracy can be further improved.

Figure 9:
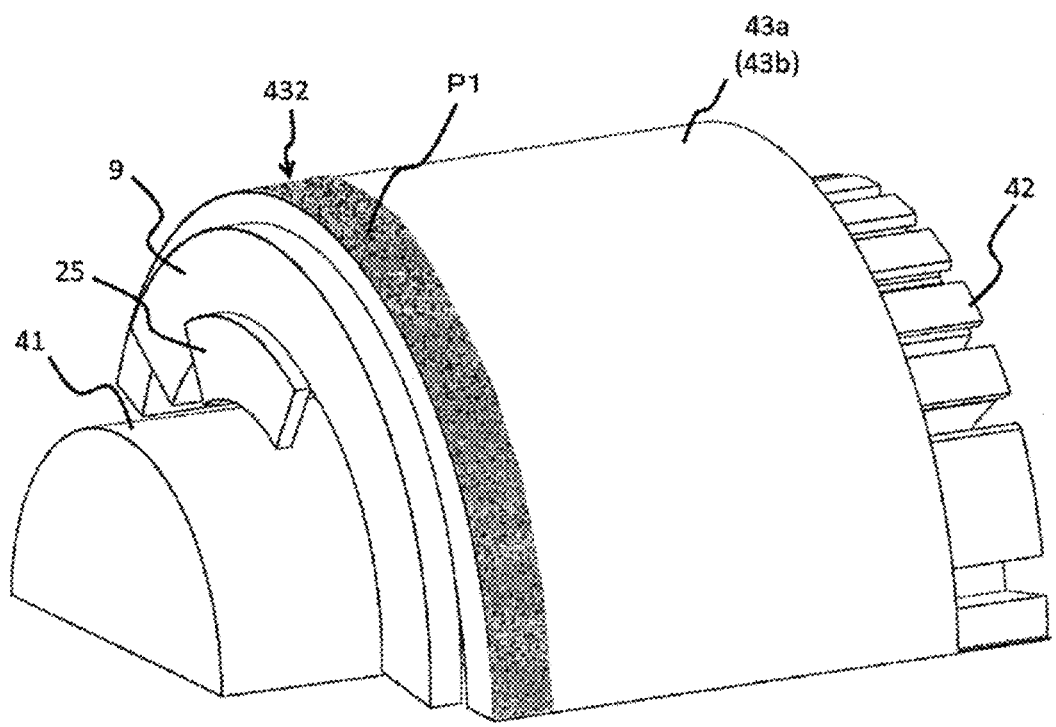
FIG. 9 is a view for illustrating another example of an end plate to be joined to the retaining ring.

Further, as illustrated in FIG. 9, a closing plate 25 configured to adjust the amount of a cooling gas introduced into the air path portions 422 of the rotor core 42 may be mounted to the end plate 9.

Figure 10:
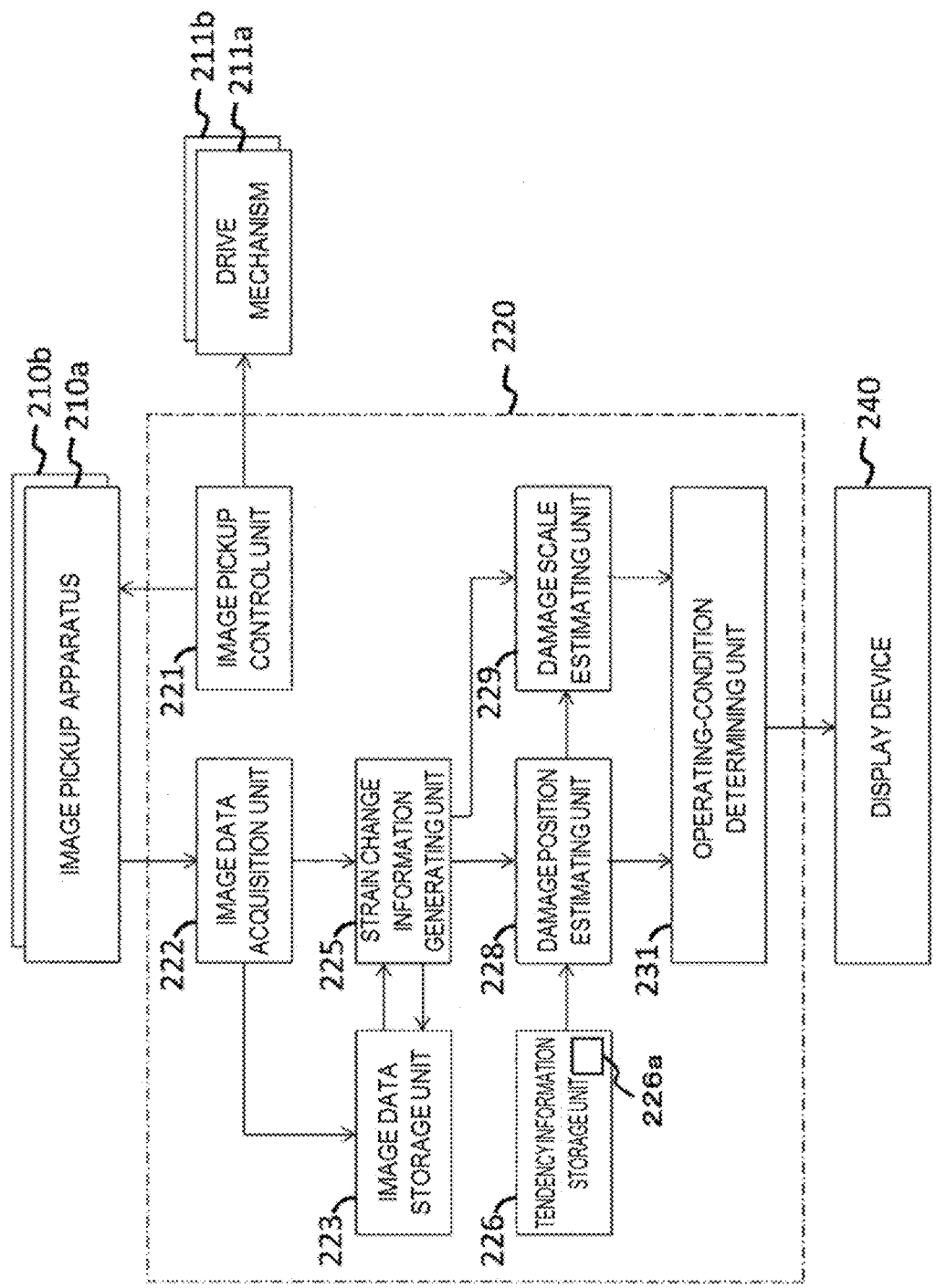
FIG. 10 is a block diagram for illustrating an example of a functional configuration of the inspection device for a rotating electric machine according to the first embodiment of the present invention.

FIG. 10 is a block diagram for illustrating an example of a functional configuration of a rotating electric machine inspection device according to the first embodiment of the present invention. The rotating electric machine inspection device according to this embodiment is achieved as the inspection device 220. As illustrated in FIG. 10, the inspection device 220 includes, as functional configurations, an image pickup control unit 221, an image data acquisition unit 222, an image data storage unit 223, a strain change information generating unit 225, a tendency information storage unit 226, a damage position estimating unit 228, a damage scale estimating unit 229, and an operating-condition determining unit 231.

The image pickup control unit 221 controls the image pickup apparatus 210a and 210b and the drive mechanism 211a and 211b so as to pick up images of the measurement target portions in the initial time period and at the inspection time, which are described above. Through the control of the image pickup control unit 221, the image pickup apparatus 210a and 210b perform image pickup, and transmit image data to the inspection device 220. The image data acquisition unit 222 acquires the image data transmitted from the image pickup apparatus 210a and 220b. The image data, which has been acquired through the image pickup in the initial time period, is stored as initial image data in the image data storage unit 223 by the image data acquisition unit 222. The image data, which has been acquired through the image pickup at the inspection time, is stored as inspection image data in the image data storage unit 223 by the image data acquisition unit 222, and is output to the strain change information generating unit 225.

The image data storage unit 223 stores the initial image data and the inspection image data, which are fed from the image data acquisition unit 222. The strain change information generating unit 225 generates strain change information of the retaining rings 43a and 43b through the digital image correlation method based on the inspection image data fed from the image data acquisition unit 222. The strain change information is information indicating an amount of deformation in the measurement target portion, which has occurred in a time period from the start of the initial time period to a current time, as an amount of change in strain distribution.

Specifically, the strain change information generating unit 225 compares the initial image data stored in the image data storage unit 223 and the inspection image data fed from the image data acquisition unit 222, and generates the strain change information based on a difference therebetween. The strain change information generating unit 225 outputs the thus generated strain change information to the damage position estimating unit 228 and the damage scale estimating unit 229. The strain change information generating unit 225 corresponds to a measurement unit in a narrow sense in this embodiment. A measurement unit in a broad sense further includes the image pickup control unit 221, the image data acquisition unit 222, and the image data storage unit 223.

The strain change information generated by the strain change information generating unit 225 may be different from that described above in its contents. For example, the strain change information may be generated in the following manner. At each inspection time, previous inspection image data stored in the image data storage unit 223 and current inspection image data fed from the image data acquisition unit 222 are compared with each other. The strain change information is generated based on a difference therebetween. More specifically, the strain change information may indicate an amount of change in strain distribution of each of the measurement target portions, which has occurred in a time period from a previous inspection time to a current inspection time. In this case, the inspection device 220 may additionally include a strain change information storage unit configured to store the strain change information generated at each inspection time. With the addition of the strain change information storage unit, a total amount of change in strain at the position of each of the measurement target portions can be specified.

The tendency information storage unit 226 is configured to store tendency information 226a. The tendency information 226a indicates a tendency of a change in strain distribution in each of the measurement target portions, which is caused when damage such as a crack occurs in the inspection target portion assumed on the rotor 4. In this embodiment, the tendency information 226a indicates a correspondence relationship between a position of damage that occurs in the rotor 4 and the strain distribution in the rotor 4 and a correspondence relationship among the position of damage, the strain distribution, and a scale of the damage. The tendency information 226a can be generated through actual measurement or based on a numeric calculation such as a simulation. The crack is an example of damage that occurs in the rotor 4, and is mainly assumed damage in the retaining ring 43a, 43b. The assumed damage also includes chipping and breaking. Thus, a plurality of pieces of tendency information 226a are generated for kinds of damage, scales of damage, and positions of damage, respectively, and are stored in the tendency information storage unit 226.

The damage position estimating unit 228 estimates a position at which damage may have occurred in the rotor 4 based on the strain change information fed from the strain change information generating unit 225 and the tendency information 226a stored in the tendency information storage unit 226. In this case, the damage position estimating unit 228 can estimate the position at which damage may have occurred by selecting one of all the pieces of the tendency information 226a, which is the closest to the strain change information, or interpolating a plurality of pieces of the tendency information 226a, which are close to the strain change information, to temporarily generate another tendency information. The position at which damage may have occurred is hereinafter referred to as "damage position".

In this embodiment, the tendency information 226a includes a plurality of kinds of distribution information. In other words, the distribution information included in the tendency information 226a is classified into a plurality of kinds. The plurality of kinds of distribution information correspond to different regions of the rotor 4. Each distribution information indicates a strain distribution in the measurement target portion when damage has occurred in a corresponding region. Each of the kinds of distribution information generally includes a plurality of pieces of distribution information including a shape of assumed damage, which have different scales. The damage position estimating unit 228 estimates the damage position based on comparison between the strain change information and the plurality of pieces of distribution information. The damage position estimating unit 228 outputs the estimated damage position to the damage scale estimating unit 229 and the operating-condition determining unit 231.

The damage scale estimating unit 229 estimates a damage scale, which is a scale of damage considered to have occurred at the damage position estimated by the damage position estimating unit 228 based on the strain change information fed from the strain change information generating unit 225. In this case, the estimated damage scale includes a kind and a magnitude of the damage. For example, when the damage is a crack, the damage scale includes not only a length of the crack but also a shape of the crack. In this case, the damage scale estimating unit 229 can estimate the damage scale by selecting one of all the pieces of the tendency information 226a, which is the closest to the strain change information, or interpolating a plurality of pieces of the tendency information 226a, which are close to the strain change information, to temporarily generate another tendency information. The damage scale estimating unit 229 outputs the estimated damage scale to the operating-condition determining unit 231. The damage position estimating unit 228 and the damage scale estimating unit 229 correspond to a damage estimating unit in this embodiment.

As described above, the damage position estimating unit 228 and the damage scale estimating unit 229 both refer to the tendency information 226a to estimate the damage position and the damage scale. Specifically, in practice, the estimations of the damage position and the estimation scale can be achieved by execution of the same processing, as described later. In FIG. 10, the estimations are separately illustrated also for clarity of the targets to be estimated.

The operating-condition determining unit 231 determines appropriate operating conditions for the rotating electric machine 100 based on the damage position estimated by the damage position estimating unit 228 and the damage scale estimated by the damage scale estimating unit 229, and outputs the thus determined operating conditions to the display device 240. The operating conditions include an operatable time period and a proper speed. The operatable time period is a time period in which the rotating electric machine 100 is estimated to be continuously operatable. The proper speed is a rotating speed of the rotor 4, which is estimated as being proper. The proper speed in this case is, for example, an upper limit rotating speed. The operating-condition determining unit 231 calculates the operatable time period and the proper speed from the damage position and the damage scale by a publicly-known method based on material characteristics and fracture mechanics. The operating-condition determining unit 231 corresponds to a time estimating unit and a speed estimating unit in this embodiment.

A stress applied to the rotor 4 depends on the rotating speed of the rotor 4. Thus, the stress applied to the rotor 4 can be reduced by controlling the rotating speed of the rotor 4. The operatable time period is a time period from start of rotation of the rotor 4 when the rotor 4 is rotated at a proper speed, in which it is estimated that the rotating electric machine 100 can be stably operated. Thus, the operatable time period serves as a criterion of maintenance time for repair of the component or replacement of the component. Thus, the operating conditions including the operatable time period and the proper speed are useful information for a worker in further improvement of the operating rate of the rotating electric machine 100.

The display device 240 is configured to display the operating conditions fed as information from the operating-condition determining unit 231. When the worker adjusts the rotating speed of the rotor 4 to the proper speed based on contents of display on the display device 240, the operation of the rotating electric machine 100 can be continued even while the rotating speed is being limited. The operatable time period is a time period in which it is not considered that a serious problem occurs for the rotating electric machine 100 even with the continued operation. Thus, the extension of the life of the rotating electric machine 100 can be assisted by providing the above-mentioned operating conditions. Further, the worker can carry out, for example, the repair of the component or the replacement of the component at an appropriate time based on the displayed operatable time period. In this manner, the operating rate of the rotating electric machine 100 can be further improved while occurrence of a serious problem is avoided or suppressed.

The operating-condition determining unit 231 may output the determined proper speed to a controller (not shown) configured to control the rotating speed of the rotor 4. In this case, the rotating speed of the rotor 4 can be automatically limited to a speed equal to or lower than the proper speed through the controller. Further, the operating-condition determining unit 231 may output the determined operatable time period to a warning device (not shown). In this case, when an operating time period of the rotating electric machine 100 becomes closer to or has reached the operatable time period, the warning device may be controlled to issue a warning, for example, emit a warning beep sound. The emission of a warning beep sound allows the worker to more reliably perform maintenance at time at which the repair of the component or the replacement of the component is to be carried out. Thus, adverse effects on the rotating electric machine 100 due to damage can be further suppressed.

The inspection device 220 may be configured to display at least one of the strain change information generated by the strain change information generating unit 225, the damage position estimated by the damage position estimating unit 228, and the damage scale estimated by the damage scale estimating unit 229. In this case, the worker can acquire a larger amount of information while seeing the display on the display device 240. As a result, the worker can more easily take measures in accordance with a current state of the rotating electric machine 100. Thus, the worker may be able to select information to be displayed on the display device 240.

As described above, the tendency information 226a stored in the tendency information storage unit 226 is used to estimate the damage position and the damage scale of the damage that may have occurred in the rotor 4. The information processing device 300 illustrated in FIG. 1 is used to generate the tendency information 226a. The tendency information 226a generated by the information processing device 300 is loaded into the inspection device 220 via, for example, a communication network or a recording medium, and is stored in the tendency information storage unit 226.

The information processing device 300 is configured to generate the tendency information 226a through, for example, a simulation. A method used to generate the tendency information 226a is not particularly limited. For example, a finite element method (FEM), a boundary element method (BEM), or a finite difference method (FDM) can be used.

As described above, the tendency information 226a is a collection of the distribution information. In this embodiment, the tendency information 226a includes first to fifth distribution information. The first distribution information indicates a strain distribution in the measurement target portion when damage has occurred in the core-side end portion 431 of the retaining ring 43. The second distribution information indicates a strain distribution in the measurement target portion when damage has occurred in the plate-side end portion 432 of the retaining ring 43. The third distribution information indicates a strain distribution in the measurement target portion when damage has occurred in an intermediate portion corresponding to a portion of the retaining ring 43, which is located between the core-side end portion 431 and the plate-side end portion 432. The fourth distribution information indicates a strain distribution in the measurement target portion when damage has occurred in the mounting portion 425 of the rotor core 42, that is, any of the magnetic-pole portions 421 or any of the retaining portions 424. The fifth distribution information indicates a strain distribution in the measurement target portion when damage has occurred in the end plate 9.

Figure 11:
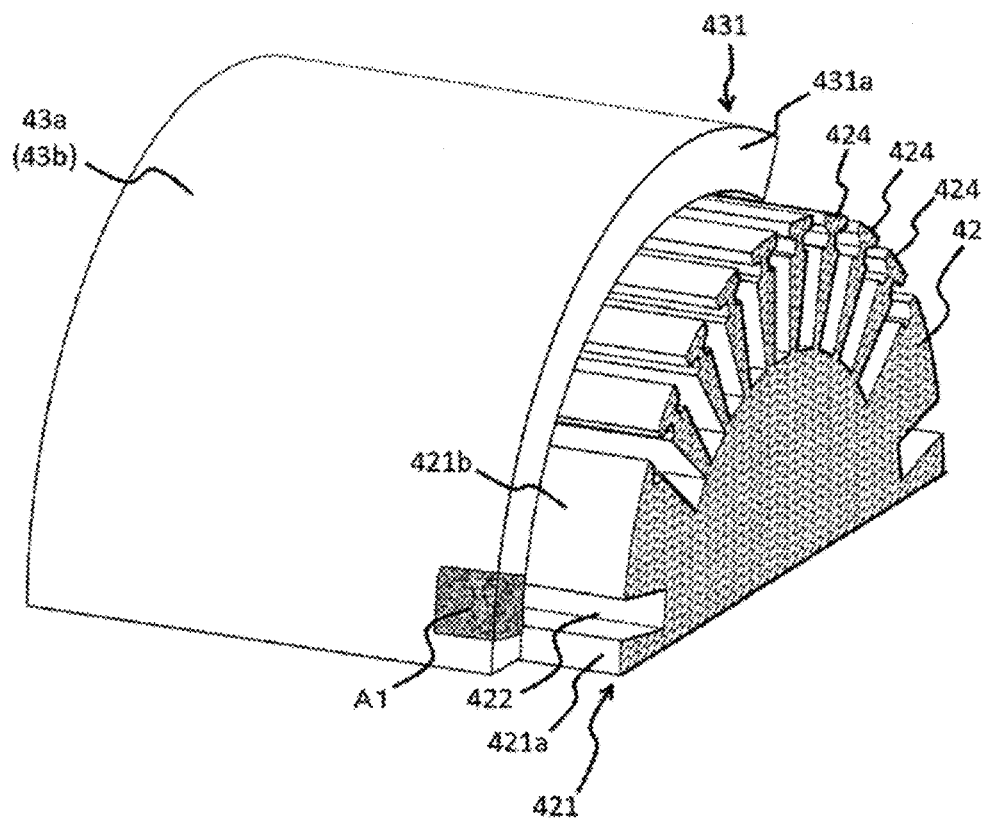
FIG. 11 is a view for illustrating an example of a modeling range in a region around an air path portion of the retaining ring.
Figure 12:
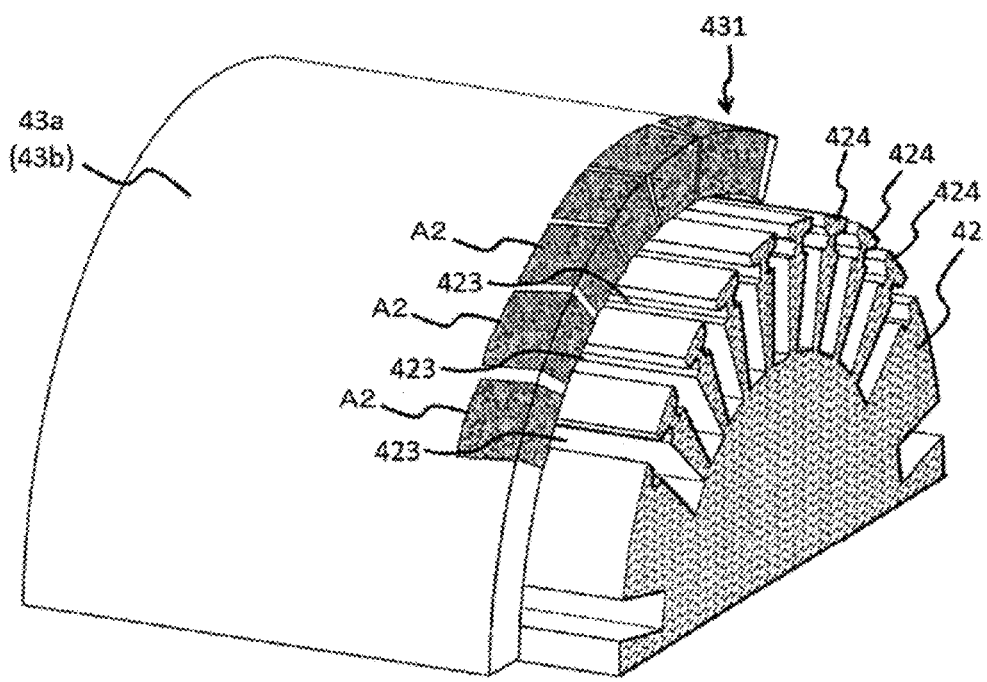
FIG. 12 is a view for illustrating an example of a modeling range in a region around the slots of the retaining ring.

All of the distribution information is generated by, for example, an actual machine simulation test with a test piece obtained by modeling a part of the retaining ring 43, a combination of an actual machine simulation test with a test piece and structural analysis through a simulation, or structural analysis through a simulation. This is because the measurement target portion is the retaining ring 43, and a distribution of the strain that occurs in the outer surface of the retaining ring 43 due to damage is required to be specified. Now, with reference to FIG. 11 and FIG. 12, an example of a modeling range in the retaining ring 43 is specifically described. FIG. 11 is a view for illustrating an example of a modeling range in a region around the air path portions of the retaining ring. FIG. 12 is a view for illustrating an example of modeling ranges in a region around the slots of the retaining ring. The examples of the modeling ranges, which are illustrated in FIG. 11 and FIG. 12, are all determined so as to generate the fourth distribution information.

In FIG. 11, a modeling range A1 includes a portion corresponding to a part of one air path portion 422 and a part of the magnetic-pole end portion 421b and the magnetic-pole center portion 421a, which sandwich the air path portion 422 and is located on the air path portion 422 side, in the circumferential direction of the rotor core 42. The modeling range A1 matches the mounting portion 425 or includes the mounting portion 425 in the axial direction. The modeling range A1 is obtained based on an assumption that damage, for example, a crack or chipping is liable to occur in a part of any one of the magnetic-pole end portion 421b and the magnetic-pole center portion 421a, which sandwich the air path portion 422 and is located on the air path portion 422 side.

The strain distribution is required to be measured only in an outer surface portion corresponding to the modeling range A1 of the retaining ring 43. Thus, the modeling range A1 corresponds to a minimum range of one measurement target portion set on the retaining ring 43. Thus, the number of measurement target portions, a position of each of the measurement target portions, and a range of each of the measurement target portions are determined based on the tendency information 226a.

Figure 13:
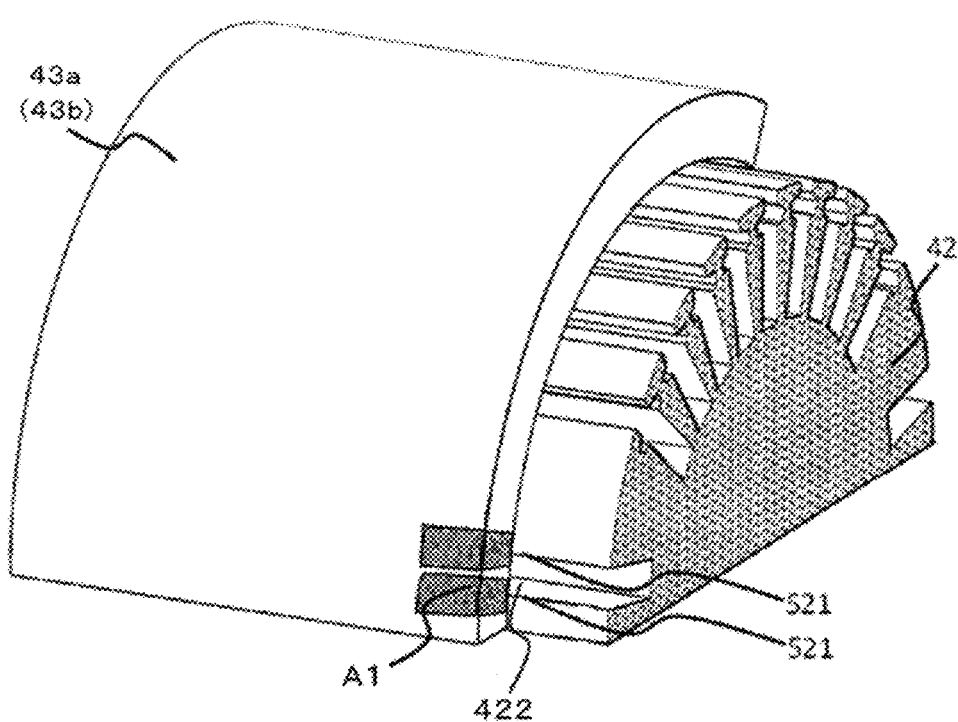
FIG. 13 is a view for illustrating a modification example of the modeling range in the region around the air path portion of the retaining ring.

As illustrated in FIG. 13, two modeling ranges A1 may be set for one air path portion 422. An example illustrated in FIG. 13 is based on an assumption that an air path end portion 521 of the magnetic-pole end portion 421b or the magnetic-pole center portion 421a is liable to be damaged. Thus, the air path end portion 521 is located in a center or in the vicinity of the center of each of the modeling ranges A1 in the circumferential direction.

In FIG. 12, a modeling range A2 is set for each of the slots 423. Each of the modeling ranges A2 has a width larger than the width 501 of the slot 423 in the circumferential direction, and a corresponding one of the slots 423 is located in a center or in the vicinity of the center of the modeling range A2. The reason why the modeling ranges A2 described above are set is the same as that for the setting of the modeling range A1. Each of the modeling ranges A2 is a minimum range of one measurement target portion.

Figure 14:
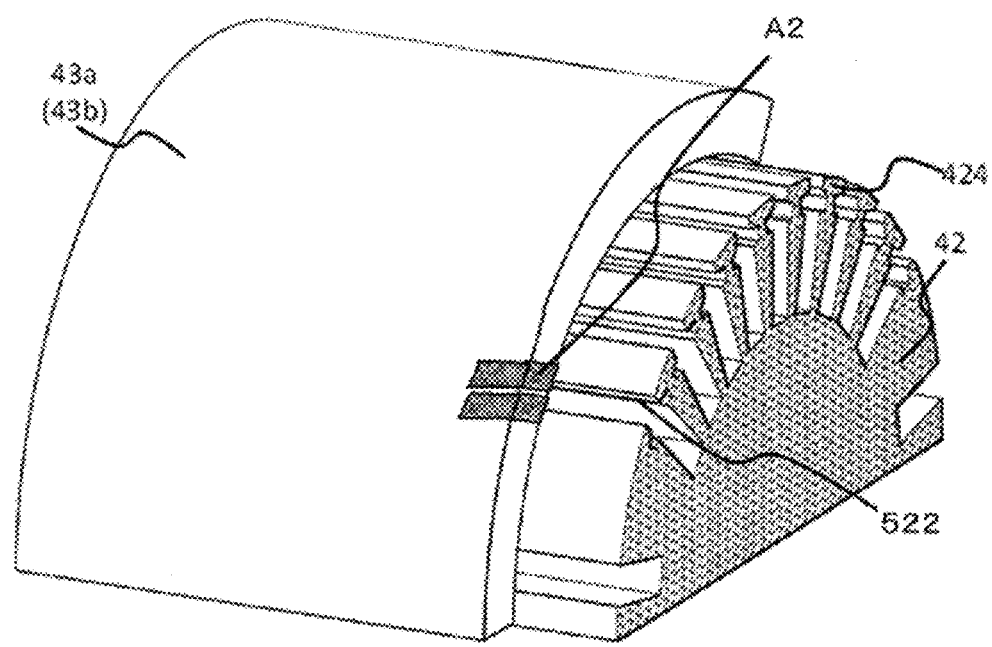
FIG. 14 is a view for illustrating a modification example of the modeling range in the region around the slots of the retaining ring.

As illustrated in FIG. 14, two modeling ranges A2 may be set for one slot 423. An example illustrated in FIG. 14 is based on an assumption that a slot end portion 522 being the magnetic-pole end portion 421b or the end portion of the retaining portion 424 is liable to be damaged. Thus, the each of the modeling ranges A2 is located in a center or in the vicinity of the center of each of the slot end portion 522 in the circumferential direction.

When the modeling range is set as illustrated in FIG. 11 to FIG. 14, a portion of the image data, which represents the retaining ring 43, is not required to be entirely processed. As a result, a load of processing is suppressed, and time required for the processing is further reduced. When the modeling range is appropriately set, a reduction in inspection accuracy can be avoided. Thus, the setting of the modeling range is advantageous in suppression of the load of the processing while maintaining high inspection accuracy.

In the rotating electric machine to be used as a turbine generator, the retaining ring has a size with a diameter falling within a range of from about 500 mm to about 2,000 mm and a length of about 1,000 mm in the axial direction. An area of the entire outer peripheral surface of the retaining ring falls within a range of from about 1,570,000 mm$^2$ to about 6,280,000 mm$^2$. When the modeling range is set as illustrated in FIG. 11 to FIG. 14, however, the image pickup is not required to be performed for the entire outer peripheral surface of the retaining ring. This means that not only time required for the image pickup is further shortened but also a calculation amount necessary for the inspection including the generation of the tendency information and the generation of the strain change information can be further reduced. The inspection accuracy can be kept high. Thus, processing performance required for the inspection device 220 is also further lowered.

Figure 15:
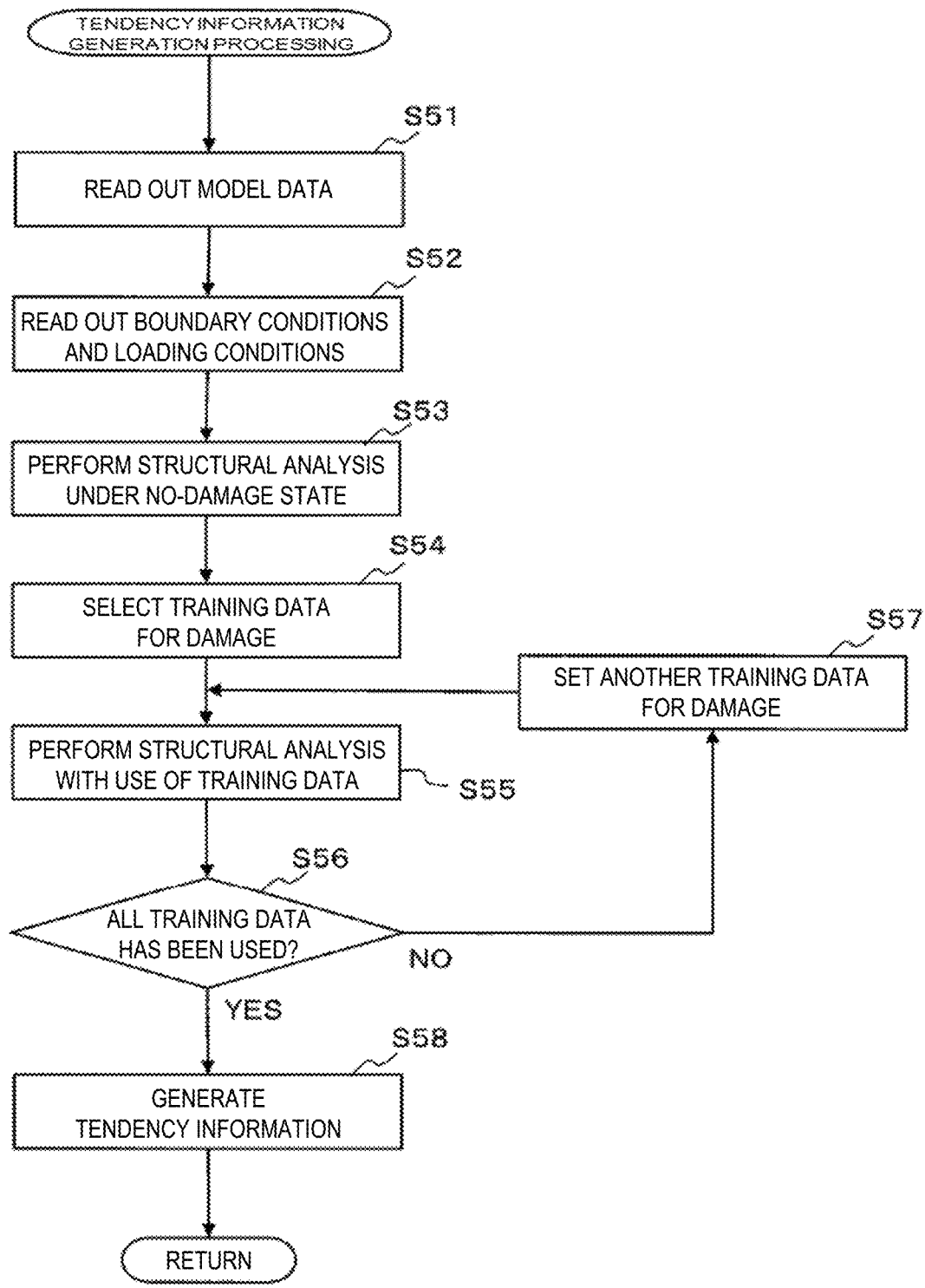
FIG. 15 is a flowchart for illustrating an example of tendency information generation processing.
Figure 21:
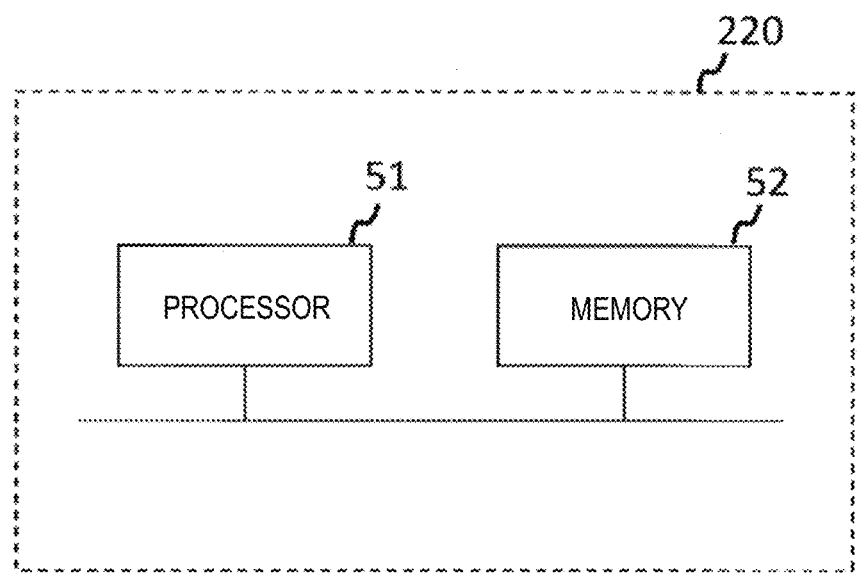
FIG. 21 is a view for illustrating a hardware configuration example when execution of a processor is assumed for achievement of functions of the inspection device for a rotating electric machine according to the first embodiment of the present invention.

FIG. 15 is a flowchart for illustrating an example of tendency information generation processing. The tendency information generation processing is executed by the information processing device 300 to generate the tendency information 226a. As illustrated in FIG. 21, it is assumed that the information processing device 300 includes a processor 51 and a memory 52, which serve as the inspection device 220. On this assumption, the tendency information generation processing is achieved when, for example, the processor 51 executes a program for generation of the tendency information 226a in the memory 52. Next, with reference to FIG. 15, the tendency information generation processing is described in detail. In this case, for convenience, the processor 51 is assumed as a subject to execute the tendency information generation processing. The execution of the tendency information generation processing corresponds to execution of a first step in this embodiment.

The above-mentioned program enables reading of various kinds of model data for structural analysis and various kinds of data such as boundary conditions, loading conditions, and training data to thereby execute the tendency information generation processing. The various kinds of model data include model data created based on an assumption of the modeling range illustrated in FIG. 11 and FIG. 12. The boundary conditions and the loading conditions specify conditions for performing the structural analysis. The training data includes training data for damage, which indicates, for example, a kind of damage, a position of occurrence of damage, and a shape of damage including a magnitude of damage. The training data may be created through the structural analysis in the following manner. Damage is reproduced in a test piece, which is modeled in the same manner as in the structural analysis, by, for example, processing so as to complement the acquired training data. In this case, it is assumed that various kinds of data described above are stored in the memory 52 installed in the information processing device.

First, in Step S51, the processor 51 reads out various kinds of model data from the memory 52. Next, in Step S52, the processor 51 reads out data including the boundary conditions, the loading conditions, and the training data. After that, in Step S53, the processor 51 performs the structural analysis under a no-damage state to obtain strain on the outer peripheral surface of the retaining ring 43.

In Step S54 performed subsequent to Step S53, the processor 51 selects the training data for damage. Next, in Step S55, the processor 51 performs the structural analysis for each corresponding model data based on an assumption of a condition in which the damage represented by the training data has occurred, and obtains an amount of change in strain on the outer surface of the retaining ring 43 for each corresponding model data. As a result, for example, when the training data is generated based on an assumption of damage which may occur in the modeling ranges A1 as illustrated in FIG. 13, the structural analysis is performed for each of at least two pieces of model data. For example, when the training data is generated based on an assumption of damage which may occur in the modeling ranges A1 and A2 as illustrated in FIG. 11 and FIG. 12, the structural analysis is performed for each of at least two pieces of model data. As a result of the structural analysis described above, one or more pieces of distribution information with training data for one damage are generated. Accordingly, each piece of distribution information is generated as information indicating a relationship among the kind of damage, the damage position, and the amount of change in strain distribution, which are indicated by the training data.

Next, in Step S56, the processor 51 determines whether or not all the training data for damage has been used. When there is training data for damage, which has not been used for the analysis, it is determined as "NO" in Step S56. Then, the processing proceeds to Step S57. When all the training data for damage has been used, it is determined as "YES" in Step S56. Then, the processing proceeds to Step S58.

In Step S57, the processor 51 sets training data for damage, which has not been used, as the training data for damage to be used for the structural analysis. After that, the processing proceeds to Step S55. In this manner, a processing loop including Step S55 to Step S57 is repeatedly executed until all the training data for damage is used. As a result, the distribution information is generated for each training data for damage and each model data.

The proceeding to Step S58 means that the generation of the distribution information to be generated is completed.

Thus, in Step S58, the processor 51 generates the tendency information 226a obtained by organizing the generated distribution information. After that, the tendency information generation processing is terminated. The thus generated tendency information 226a may be stored in the memory 52, but may also be output to a designated storage destination. The storage destination may be a recording medium, or may be another information processing device to which the tendency information can be transmitted via a communication network. The information processing device may be the inspection device 220.

As described above, in this embodiment, the tendency information 226a is generated by the information processing device 300, which is different from the inspection device 220. However, the inspection device 220 may generate the tendency information 226a. Thus, the information processing device configured to generate the tendency information 226a is not particularly limited.

Next, processing to be executed by the inspection device 220 is specifically described with reference to flowcharts of FIG. 16 to FIG. 20.

The components of the inspection device 220, which are illustrated in FIG. 10, may be achieved by hardware such as an electronic circuit. The hardware may be capable of executing a program. As a configuration example of the hardware capable of executing a program, as illustrated in FIG. 21, hardware including the processor 51 and the memory 52 is considered. The processor 51 is a processing device capable of executing a program. The memory 52 is needed to execute the program. In this example, the image data storage unit 223 and the tendency information storage unit 226 correspond to the memory 52, and other components are achieved by the processor 51 that executes the program with use of the memory 52. Specifically, the other components include the image pickup control unit 221, the image data acquisition unit 222, the strain change information generation unit 225, the damage position estimating unit 228, the damage scale estimating unit 229, and the operating-condition determining unit 231. In this case, for convenience, the description is given assuming the processor 51 as a subject configured to execute the processing. The term "memory 52" is used to represent the image data storage unit 223 and the tendency information storage unit 226.

Figure 16:
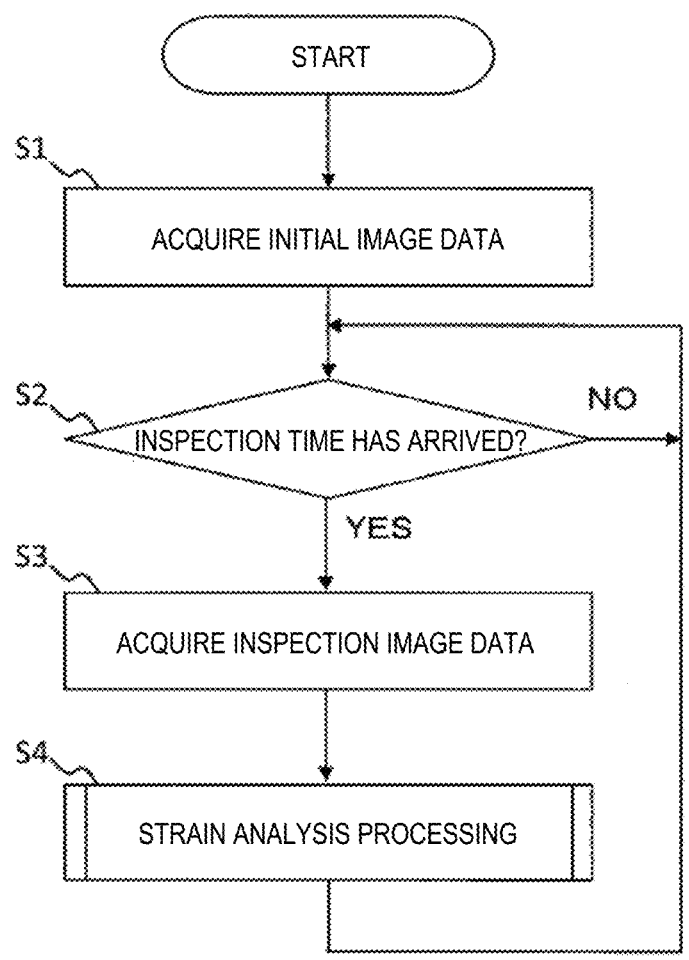
FIG. 16 is a flowchart for illustrating an example of whole processing achieved by the inspection device.

FIG. 16 is a flowchart for illustrating an example of whole processing to be achieved by the inspection device. First, with reference to FIG. 16, the whole processing is described in detail.

First, in Step S1, the processor 51 performs control so as to acquire the initial image data, and stores the image data transmitted from the image pickup apparatus 210a and 210b through the control as the initial image data in the memory 52. Through the execution of the processing in Step S1, the image pickup control unit 221 and the image data acquisition unit 222 are achieved. The processing in Step S1 is executed by, for example, an operation of an operating unit (not shown), which is performed by a worker to direct the acquisition of the initial image data.

In Step S2 to Step S4 subsequent to Step S1, processing is automatically executed based on predetermined setting. After the start of the operation of the rotating electric machine 100, an inspection for coping with damage that occurs in the rotor 4 is automatically carried out through the execution of the processing in Step S2 to Step S4.

In Step S2, the processor 51 determines whether or not the inspection time has arrived. When conditions set for determination of the arrival of the inspection time are satisfied, it is determined as "YES" in Step S2. Then, the processing proceeds to Step S3. When the conditions are not satisfied, it is determined as "NO" in Step S2. Then, the processing returns to Step S2. Thus, the inspection is not performed between the end of the inspection and a next inspection time.

In Step S3, the processor 51 performs control to acquire the inspection image data, and stores the image data transmitted from the image pickup apparatus 210a and 210b through the control as the inspection image data in the memory 52. Also through the execution of the processing in Step S3, the image pickup control unit 221 and the image data acquisition unit 222 are achieved.

In Step S4, the processor 51 executes strain analysis processing to estimate whether or not damage has occurred with use of the initial image data stored in the memory 52 and the currently acquired inspection image data. After the execution of the strain analysis processing, the processing returns to Step S2 described above.

In FIG. 16, the execution of the processing in Step S3 and Step S4 corresponds to execution of a second step in this embodiment in a narrow sense. The generation of the strain change information needs the initial image data. Thus, the execution of the second step includes the processing in Step S1 in a broad sense. The execution of the processing in Step S4 corresponds to execution of a third step in this embodiment.

Figure 17:
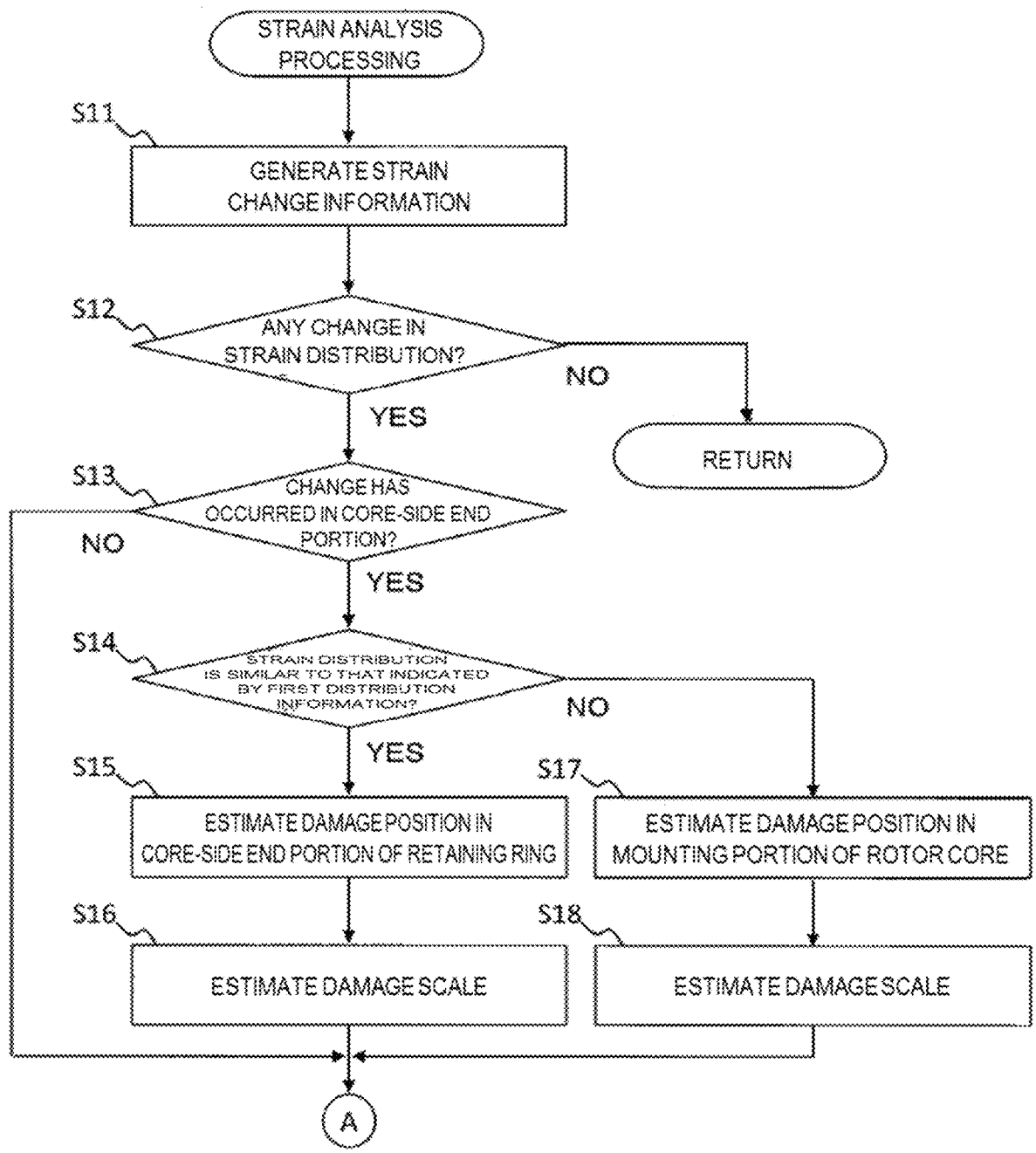
FIG. 17 is a flowchart for illustrating an example of strain analysis processing.
Figure 18:
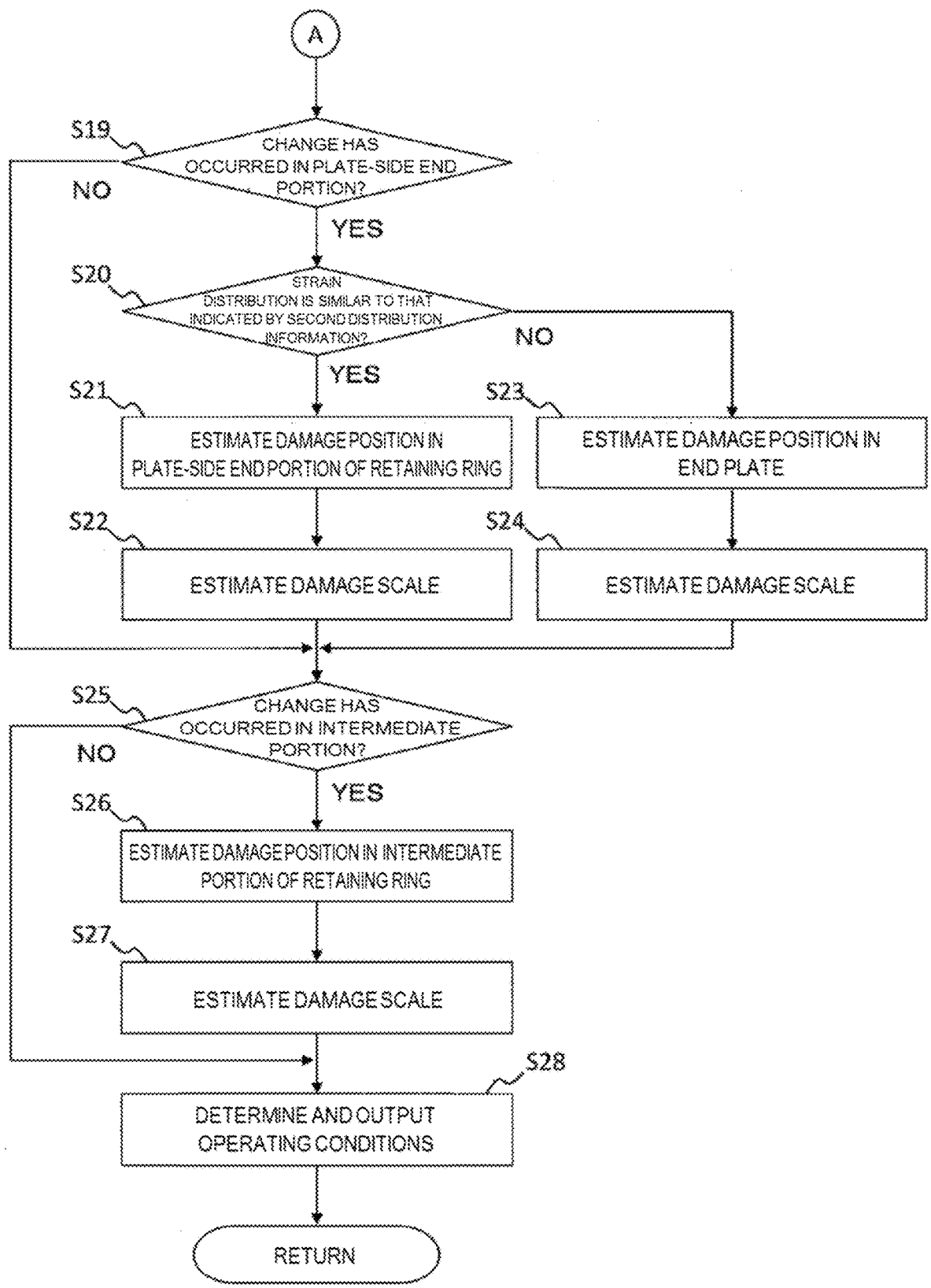
FIG. 18 is a flowchart for illustrating the example of the strain analysis processing.

FIG. 17 and FIG. 18 are flowcharts for illustrating an example of the strain analysis processing to be executed as Step S4. Next, with reference to FIG. 17 and FIG. 18, the strain analysis processing is described in detail. The strain change information generating unit 225, the damage position estimating unit 228, the damage scale estimating unit 229, and the operating-condition determining unit 231 are achieved by the execution of the strain analysis processing.

In Step S11, the processor 51 accesses the memory 52 to read out the initial image data and the currently acquired inspection image data to thereby generate the strain change information. As described above, the strain change information indicates a change in strain distribution in the measurement target portion, which is obtained by the digital image correlation method, and is generated for each of the measurement target portions. Through the execution of the processing in Step S11, the strain change information generating unit 225 is achieved.

Next, in Step S12, the processor 51 determines whether or not the strain distribution in the measurement target portion has changed from that in the initial time period by a specified value or larger based on the generated strain change information. When the generated strain change information includes strain change information indicating that an amount of displacement in any of portions represented thereby is equal to or larger than the specified value, it is determined as "YES" in Step S12. Then, the processing proceeds to Step S13. When the generated strain change information does not include such strain change information, it is determined as "NO" in Step S12, and the strain analysis processing is terminated in this step. The determination of "YES" in Step S12 means that it is estimated that damage that may affect the measurement target portion has occurred in any of the measurement target portions. Thus, the determination processing in Step S12 corresponds to estimation of the presence or the absence of damage.

As described above, the tendency information 226a includes the first to fifth distribution information. The first to fifth distribution information differ from each other in component for which damage is to be assumed or position of the component. Thus, in Steps S13 to Step S27, for each of the measurement target portions corresponding to the strain change information in which the amount of displacement of any of the portions is equal to or larger than the specified value, a scale of the damage that has caused the amount of displacement of the specified value or larger in the measurement target portion and a position of the damage are estimated. The strain change information in which the amount of displacement of any of the portions is equal to or larger than the specified value is hereinafter referred to as "target strain change information". One or more pieces of the target strain change information are provided. The specified value is set for each of the measurement target portions. The damage position estimating unit 228 and the damage scale estimating unit 229 are achieved by the execution of the processing in Step S13 to Step S27. The determination processing in Step S12 achieves, for example, part of functions of the damage position estimating unit 228.

In Step S13, the processor 51 determines whether the measurement target portions corresponding to the target strain change information include the measurement target portion located in the core-side end portion 431 of the retaining ring 43. When the measurement target portions include the measurement target portion located in the core-side end portion 431, it is determined as "YES" in Step S13. Then, the processing proceeds to Step S14. When the measurement target portions do not include such a measurement target portion, it is determined as "NO" in Step S13. Then, the processing proceeds to Step S19 in FIG. 18.

In Step S14, the processor 51 determines whether the first distribution information includes a first distribution information piece indicating a strain distribution similar to the strain distribution indicated by the target strain change information. When the first distribution information includes the first distribution information piece indicating a strain distribution similar to the strain distribution indicated by the target strain change information, it is determined as "YES" in Step S14. Then, the processing proceeds to Step S15. When the first distribution information does not include such a first distribution information piece, it is determined as "NO" in Step S14. Then, the processing proceeds to Step 17.

More specifically, the determination of similarity in Step S14 is required to be performed, for example, in the following manner. For each of the first distribution information pieces, a matching degree in strain distribution between the first distribution information piece and the target strain change information is calculated. Then, it is determined whether the calculated matching degrees include a matching degree larger than a predetermined threshold value. A method of calculating the matching degree is not particularly limited. For example, a least-squares method or a regularized least-squares method may be used. When the matching degree is calculated by the least-squares method or the regularized least-squares method, it can be determined that the first distribution information includes the first distribution information piece having a similar strain distribution when the calculated matching degree is equal to or smaller than the threshold value.

In Step S15 and Step S16, the processor 51 extracts the first distribution information piece to be referred to from the first distribution information, and estimates a position of damage which has occurred in the core-side end portion 431 of the retaining ring 43 and a scale of the damage with use of the extracted first distribution information piece. After the end of the estimation, the processing proceeds to Step S19 in FIG. 18.

The proceeding to Step S17 means that it is estimated that damage has occurred in the mounting portion 425 of the rotor core 42. Thus, in Step S17 and Step S18, the processor 51 extracts a fourth distribution information piece to be referred to from the fourth distribution information, and estimates a position of the damage which has occurred in the mounting portion 425 and a scale of the damage with use of the extracted fourth distribution information piece. After the end of the estimation, the processing proceeds to Step S19 in FIG. 18. The position of the damage, which is estimated in this step, corresponds to a position of any one of the magnetic pole portions 421 or any one of the retaining portions 424.

In Step S19, the processor 51 determines whether the measurement target portions corresponding to the target strain change information include the measurement target portion located in the plate-side end portion 432 of the retaining ring 43. When the measurement target portions include the measurement target portion located in the plate-side end portion 432, it is determined as "YES" in Step S19. Then, the processing proceeds to Step S20. When the measurement target portions do not include such a measurement target portion, it is determined as "NO" in Step S19. Then, the processing proceeds to Step S25.

In Step S20, the processor 51 determines whether the second distribution information includes a second distribution information piece indicating a strain distribution similar to the strain distribution indicated by the target strain change information. When the second distribution information includes the second distribution information piece indicating a strain distribution similar to the strain distribution indicated by the target strain change information, it is determined as "YES" in Step S20. Then, the processing proceeds to Step S21. When the second distribution information does not include such a second distribution information piece, it is determined as "NO" in Step S20. Then, the processing proceeds to Step 23. The determination of similarity in Step S20 is only required to be carried out in the same manner as in Step S14 described above.

In Step S21 and Step S22, the processor 51 extracts the second distribution information piece to be referred to from the second distribution information, and estimates a position of damage which has occurred in the plate-side end portion 432 of the retaining ring 43 and a scale of the damage with use of the extracted second distribution information piece. After the end of the estimation, the processing proceeds to Step S25.

The proceeding to Step S23 means that it is estimated that the damage has occurred not in the plate-side end portion 432 of the retaining ring 43 but in the end plate 9. Thus, in Step S23 and Step S24, the processor 51 extracts a fifth distribution information piece to be referred to from the fifth distribution information, and estimates a position of the damage which has occurred in the end plate 9 and a scale of the damage with use of the extracted fifth distribution information piece. After the end of the estimation, the processing proceeds to Step S25.

In Step S25, the processor 51 determines whether the measurement target portions corresponding to the target strain change information include the measurement target portion located in the intermediate portion of the retaining ring 43. When the measurement target portions include the measurement target portion located in the intermediate portion of the retaining ring 43, it is determined as "YES" in Step S25. Then, the processing proceeds to Step S26. When the measurement target portions do not include such a measurement target portion, it is determined as "NO" in Step S25. Then, the processing proceeds to Step S28. The determination of "NO" in Step S25 means that all the target strain change information has been processed.

In Step S26 and Step S27, the processor 51 extracts the third distribution information piece to be referred to from the third distribution information, and estimates a position of damage which has occurred in the intermediate portion of the retaining ring 43 and a scale of the damage with use of the extracted third distribution information piece. After the end of the estimation, the processing proceeds to Step S28.

In Step S28, the processor 51 determines proper operating conditions based on the estimated damage position and damage scale by a publicly-known method based on material characteristics and fracture mechanics. The processor 51 controls the display device 240 to display the determined operating conditions. In this manner, the worker can take measures such as adjustment of the rotating speed of the rotor to a proper speed or examination of a time at which the operation of the rotating electric machine 100 is to be stopped, that is, a time at which maintenance is to be performed, based on the display on the display device 240. As a result, the extension of the life of the rotating electric machine 100 can more easily be achieved.

Figure 19:
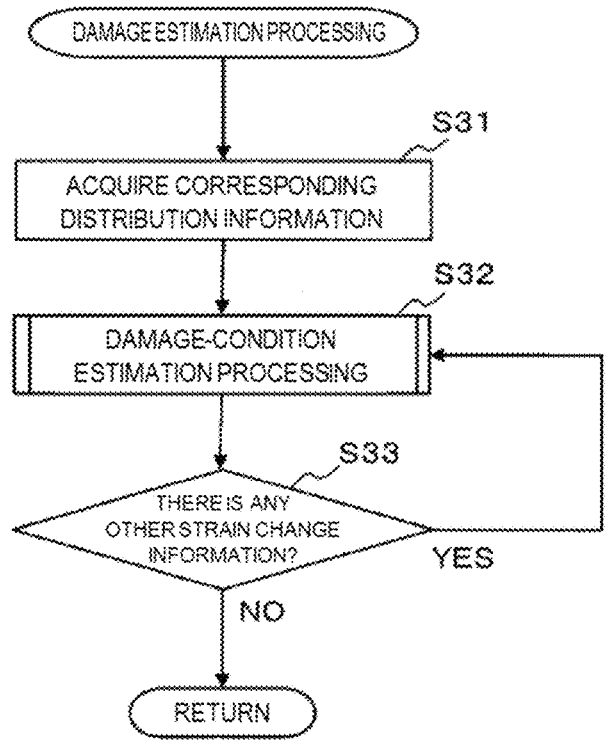
FIG. 19 is a flowchart for illustrating an example of damage estimation processing.

FIG. 19 is a flowchart for illustrating an example of damage estimation processing. In practice, processing in Step S15 and Step S16, processing in Step S17 and Step S18, processing in Step S21 and Step S22, processing in Step S23 and Step S24, and processing in Step S26 and Step S27 are executed as the damage estimation processing. Next, with reference to FIG. 19, the damage estimation processing is described in detail.

First, in Step S31, the processor 51 acquires corresponding distribution information from the tendency information 226a. The corresponding distribution information is different depending on conditions of the execution. For example, when the damage estimation processing is executed as Step S17 and Step S18, the corresponding distribution information is the first distribution information.

Next, in Step S32, the processor 51 executes damage-condition estimation processing for estimating a position at which damage has occurred and a scale of the damage with use of the acquired distribution information. After the execution of the damage-condition estimation processing, the processing proceeds to Step S33.

The damage-condition estimation processing is required to be performed for each target strain change information corresponding to the position assumed based on the acquired distribution information among the target strain change conditions. Thus, in Step S33, the processor 51 determines whether or not there is any other target strain change information to be processed. When there is other target strain change information to be processed, it is determined as "YES" in Step S33. Then, the processing returns to Step S32. In this manner, a position at which damage has occurred and a scale of the damage are estimated for each target strain change information to be processed. Meanwhile, when there is no target strain change information to be processed, it is determined as "NO" in Step S33. Then, the damage estimation processing is terminated in this step.

Figure 20:
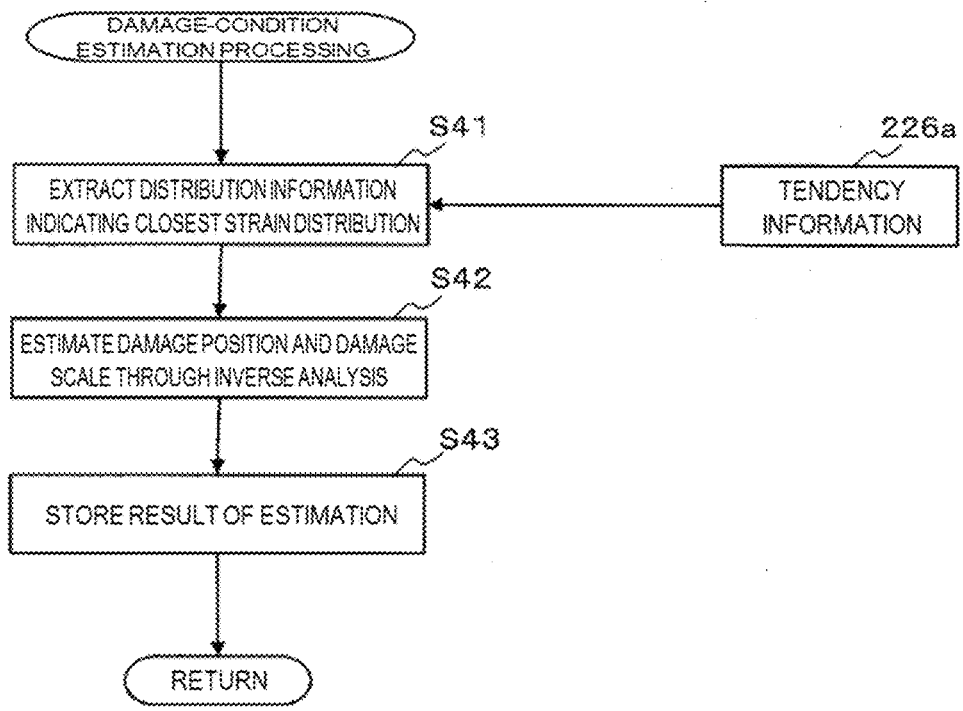
FIG. 20 is a flowchart for illustrating an example of damage-condition estimation processing.

FIG. 20 is a flowchart for illustrating the damage-condition estimation processing to be executed as Step S32. Next, with reference to FIG. 20, the damage-condition estimation processing is described in detail. As described above, the distribution information to be referred to in the damage-condition estimation processing is acquired in Step S31 in the damage estimation processing. The target strain change information to be referred to is the target strain change information, which has been selected at a time of the execution of the damage-condition estimation processing.

First, in Step S41, the processor 51 extracts the distribution information indicating the strain distribution which is the closest to that indicated by the target strain change information, from the distribution information that has already been acquired in Step S31.

Next, in Step S42, the processor 51 estimates a position of damage that has caused the strain distribution indicated by the target strain change information and a scale of the damage by selecting tendency information including the strain change information closest to that of the extracted distribution information from all the tendency information 226a, or temporarily generating another tendency information through interpolation of a plurality of pieces of tendency information 226a close to the strain change information. In Step S43 subsequent to Step S42, the processor 51 stores a result of estimation in, for example, the memory 52. After the storage of the result of estimation, the damage-condition estimation processing is terminated.

In this embodiment, the retaining rings 43 and the rotor core 42 are joined to each other through the shrink-fit. However, the retaining rings 43 and the rotor core 42 may be joined to each other by another method such as welding. Similarly, the retaining rings 43 and the end plates 9 may be joined to each other by another method such as welding. Even when the welding is used for joining, a residual stress is generated. Thus, it is preferred that the measurement target portion be set on each of the retaining rings 43.

When a change in strain distribution is obtained by the digital image correlation method, the initial image data may be the image data that is first acquired after the start of the operation of the rotating electric machine 100. On the assumption that the retaining rings 43 after the execution of the maintenance are in an appropriate state, the initial image data may be acquired after the execution of the maintenance. The initial image data may be image data prepared as a default.

When a change in strain distribution is obtained by the digital image correlation method, the image pickup is performed under a condition that the rotor 4 is being rotated at low speed. However, the image pickup may also be performed under a state in which the rotor 4 is stopped. That is, the drive mechanisms 211a and 211b and the image pickup apparatus 210a and 210b may be movable in the circumferential direction. The image pickup may be performed under a state in which the rotor 4 is being rotated at high speed. In this case, the damage can be estimated based on a change in strain distribution, which is caused when the rotor 4 is rotated at high speed. Further, a plurality of image pickup apparatus may be installed for image pickup for each of the retaining rings 43a and 43b. When the image pickup apparatus are installed in this manner, the distribution information to be referred to can be specified or a target range of the distribution information can be further narrowed by the image pickup apparatus, which transmits the image data.

In this embodiment, the tendency information 226a includes the first to fifth distribution information. The tendency information 226a is not required to include all the first to fifth distribution information. That is, the damage may be estimated after the measurement target portion is set only on, for example, the core-side end portion 431 or the plate-side end portion 432 of the retaining ring 43. When a position at which damage is liable to occur is identified in advance, high inspection accuracy can be maintained even after a range for which occurrence of damage is estimated is narrowed. A calculation amount required for the inspection can be further reduced.

In this embodiment, when occurrence of damage is estimated, the damage position and the damages scale are estimated together. However, the damage position and the damage scale are not required to be estimated. The reason is as follows. Even when the worker is notified only of the estimation of occurrence of damage, the worker can be assisted in performing an appropriate operation of the rotating electric machine 100. Contents to be estimated together with the occurrence of damage may be any one of the damage position and the damage scale.

Further, in this embodiment, the inspection device 220 controls the image pickup apparatus 210a and 210b. The inspection device 220 is not required to control an image pickup apparatus such as the image pickup apparatus 210. That is, for example, the inspection device 220 may merely estimate damage based on image data obtained by the image pickup performed by the image pickup apparatus. In this case, the inspection device 220 may be configured to receive image data transmitted via, for example, a communication network to estimate damage. When the inspection device 220 is connected to such a communication network, the inspection device 220 may inspect a plurality of rotating electric machines 100.

REFERENCE SIGNS LIST

1 frame, 3 stator, 4 rotor, 9 end plate, 41 rotary shaft, 42 rotor core, 43a, 43b retaining ring, 44A, 44B rotor winding, 100 rotating electric machine, 200 inspection system, 210a, 210b image pickup apparatus, 211a, 211b drive mechanism, 220 inspection device, 221 image pickup control unit, 222 image data acquisition unit, 223 image data storage unit, 225 strain change information generating unit (measurement unit), 226 tendency information storage unit, 226a tendency information, 228 damage position estimating unit (damage estimating unit), 229 damage scale estimating unit (damage estimating unit), 231 operating-condition determining unit (time estimating unit and speed estimating unit), 240 display device, 300 information processing device, 421 magnetic-pole portion, 422 air path portion, 423 slot, 424 retaining portion, 431 core-side end portion, 431a end surface, 432 plate-side end portion

The invention claimed is:

1. An inspection device for a rotating electric machine, comprising:
   at least one image pickup apparatus disposed within the rotating electric machine and configured to capture at least one image of a measurement target portion set on an outer surface of a rotor included in the rotating electric machine;
   a storage circuitry to store tendency information indicating a relationship among a position of damage that occurs in an inspection target portion being a range to be inspected of the rotor included in the rotating electric machine, a scale of the damage, and an amount of deformation that occurs in the measurement target portion set on the outer surface of the rotor;
   a measurement circuitry to measure the amount of deformation that has occurred in the measurement target portion based on the at least one image captured by the at least one image pickup apparatus; and
   a damage estimating circuitry to estimate the position and the scale of the damage that has occurred in the measurement target portion based on the tendency information and the amount of deformation in the measurement target portion, which has been measured by the measurement circuitry,
   wherein the inspection target portion is located in an area of the rotating electric machine that is not visible without disassembly of the rotating electric machine.

2. The inspection device for a rotating electric machine according to claim 1, wherein the inspection target portion includes retaining rings each being configured to hold a state of rotor windings inserted into a rotor core, and at least a part of an outer surface of each of the retaining rings is set as the measurement target portion.

3. The inspection device for a rotating electric machine according to claim 2, wherein the inspection target portion further includes a mounting portion formed on the rotor core for each of the retaining rings.

4. The inspection device for a rotating electric machine according to claim 3, wherein the measurement target portion set on the outer surface of each of the retaining rings includes a range in which the mounting portion is located in an axial direction of the rotor core.

5. The inspection device for a rotating electric machine according to claim 3, wherein the measurement target portion set on the outer surface of each of the retaining rings includes a range in which an air path portion formed in a groove-like shape in the rotor core is located in an axial direction of the rotor core.

6. The inspection device for a rotating electric machine according to claim 4, wherein the measurement target portion set on the outer surface of each of the retaining rings includes a range in which an air path portion formed in a groove-like shape in the rotor core is located in an axial direction of the rotor core.

7. The inspection device for a rotating electric machine according to claim 3, wherein the measurement target portion set on the outer surface of each of the retaining rings includes a range in which slots formed in the rotor core for insertion of the rotor windings are located in an axial direction of the rotor core.

8. The inspection device for a rotating electric machine according to claim 4, wherein the measurement target portion set on the outer surface of each of the retaining rings includes a range in which slots formed in the rotor core for insertion of the rotor windings are located in an axial direction of the rotor core.

9. The inspection device for a rotating electric machine according to claim 3, wherein the measurement target portion set on the outer surface of each of the retaining rings includes a range in which an end plate to be mounted to the retaining ring is located in an axial direction of the rotor core.

10. The inspection device for a rotating electric machine according to claim 4, wherein the measurement target portion set on the outer surface of each of the retaining rings includes a range in which an end plate to be mounted to the retaining ring is located in an axial direction of the rotor core.

11. The inspection device for a rotating electric machine according to claim 9, wherein the inspection target portion includes the end plates.

12. The inspection device for a rotating electric machine according to claim 10, wherein the inspection target portion includes the end plates.

13. The inspection device for a rotating electric machine according to claim 1, wherein the damage includes a crack.

14. The inspection device for a rotating electric machine according to claim 1, further comprising a time estimating circuitry to estimate a time period in which the rotating electric machine is continuously operatable based on the amount of deformation in the measurement target portion, which has been measured by the measurement circuitry.

15. The inspection device for a rotating electric machine according to claim 1, further comprising a speed estimating circuitry to estimate a rotating speed of the rotor, which is to be set as an upper limit, based on the amount of deformation in the measurement target portion, which has been measured by the measurement circuitry.

16. The inspection device for a rotating electric machine according to claim 1, wherein the measurement circuitry is configured to obtain the amount of deformation based on initial image data acquired through image pickup for the measurement target portion by the image pickup apparatus in an initial time period, which is a time period from completion of manufacture of the rotating electric machine to start of an operation of the rotating electric machine and inspection image data acquired through image pickup for the measurement target portion by the image pickup apparatus at an inspection time.

17. An inspection system, comprising:
the inspection device for a rotating electric machine of claim 1;
a display device configured to display the position and the scale of the damage that has occurred in the measurement target portion, which has been estimated by the inspection device,
wherein the measurement circuitry is configured to obtain the amount of deformation based on initial image data acquired through image pickup for the measurement target portion by image pickup apparatus in an initial time period, which is a time period from completion of manufacture of the rotating electric machine to start of an operation of the rotating electric machine and inspection image data acquired through image pickup for the measurement target portion by the image pickup apparatus at an inspection time.

* * * * *